(12) United States Patent
Lin et al.

(10) Patent No.: US 10,354,984 B2
(45) Date of Patent: Jul. 16, 2019

(54) SEMICONDUCTOR ASSEMBLY WITH ELECTROMAGNETIC SHIELDING AND THERMALLY ENHANCED CHARACTERISTICS AND METHOD OF MAKING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

(*) Notice: Subject to any disclaimer, the term of this patent is extended or adjusted under 35 U.S.C. 154(b) by 96 days.

(21) Appl. No.: 15/353,537

(22) Filed: Nov. 16, 2016

(65) Prior Publication Data

US 2017/0062394 A1    Mar. 2, 2017

Related U.S. Application Data

(63) Continuation-in-part of application No. 15/289,126, filed on Oct. 8, 2016, now abandoned, which is a
(Continued)

(51) Int. Cl.
*H01L 25/00* (2006.01)
*H01L 23/552* (2006.01)
(Continued)

(52) U.S. Cl.
CPC ............ *H01L 25/50* (2013.01); *H01L 21/561* (2013.01); *H01L 21/6835* (2013.01); *H01L 23/13* (2013.01); *H01L 23/16* (2013.01); *H01L 23/36* (2013.01); *H01L 23/3675* (2013.01); *H01L 23/49816* (2013.01); *H01L 23/49838* (2013.01); *H01L 23/5385* (2013.01);
(Continued)

(58) Field of Classification Search
None
See application file for complete search history.

(56) References Cited

U.S. PATENT DOCUMENTS 5,790,384 A    8/1998    Ahmad et al.
5,801,072 A    9/1998    Barber
(Continued)

*Primary Examiner* — Matthew L Reames
*Assistant Examiner* — Steven B Gauthier
(74) *Attorney, Agent, or Firm* — Pai Patent & Trademark Law Firm; Chao-Chang David Pai

(57) ABSTRACT

A semiconductor assembly includes an encapsulated device and a thermally enhanced device face-to-face mounted together through first and second routing circuitries and a heat spreader that provides thermal dissipation and electromagnetic shielding. The encapsulated device has a first semiconductor chip sealed in an encapsulant, whereas the thermally enhanced device has a second semiconductor chip thermally conductible to a shielding lid of the heat spreader and laterally surrounded by posts of the heat spreader. The first and second semiconductor chips are mounted on two opposite sides of the first routing circuitry, and the second routing circuitry is disposed on the shielding lid and electrically coupled to the first routing circuitry by bumps. The first and second routing circuitries provide staged fan-out routing for the first and second semiconductor chips.

11 Claims, 27 Drawing Sheets

Related U.S. Application Data continuation-in-part of application No. 15/166,185, filed on May 26, 2016, now Pat. No. 10,121,768.

(60) Provisional application No. 62/166,771, filed on May 27, 2015.

(51) Int. Cl.

| | |
|---|---|
| *H01L 23/367* | (2006.01) |
| *H01L 23/538* | (2006.01) |
| *H01L 23/498* | (2006.01) |
| *H01L 23/13* | (2006.01) |
| *H01L 23/16* | (2006.01) |
| *H01L 23/36* | (2006.01) |
| *H01L 21/56* | (2006.01) |
| *H01L 23/544* | (2006.01) |
| *H01L 23/00* | (2006.01) |
| *H01L 21/683* | (2006.01) |
| *H01L 25/065* | (2006.01) |
| *H01L 25/03* | (2006.01) |
| *H01L 23/31* | (2006.01) |

(52) U.S. Cl.
CPC ........ *H01L 23/5389* (2013.01); *H01L 23/544* (2013.01); *H01L 23/552* (2013.01); *H01L 24/19* (2013.01); *H01L 24/20* (2013.01); *H01L 24/97* (2013.01); *H01L 25/03* (2013.01); *H01L 25/0657* (2013.01); *H01L 21/568* (2013.01); *H01L 23/3128* (2013.01); *H01L 23/3135* (2013.01); *H01L 23/49822* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 25/0652* (2013.01); *H01L 2221/68359* (2013.01); *H01L 2221/68381* (2013.01); *H01L 2223/54426* (2013.01); *H01L 2223/54486* (2013.01); *H01L 2224/04105* (2013.01); *H01L 2224/12105* (2013.01); *H01L 2224/16227* (2013.01); *H01L 2224/16235* (2013.01); *H01L 2224/32145* (2013.01); *H01L 2224/32225* (2013.01); *H01L 2224/32245* (2013.01); *H01L 2224/48091* (2013.01); *H01L 2224/48227* (2013.01); *H01L 2224/48235* (2013.01); *H01L 2224/73204* (2013.01); *H01L 2224/73253* (2013.01); *H01L 2224/73265* (2013.01); *H01L 2224/73267* (2013.01); *H01L 2224/81005* (2013.01); *H01L 2224/81203* (2013.01); *H01L 2224/81207* (2013.01); *H01L 2224/81815* (2013.01); *H01L 2224/83005* (2013.01); *H01L 2224/8314* (2013.01); *H01L 2224/83132* (2013.01); *H01L 2224/92225* (2013.01); *H01L 2224/92244* (2013.01); *H01L 2224/97* (2013.01); *H01L 2225/0651* (2013.01); *H01L 2225/06517* (2013.01); *H01L 2225/06537* (2013.01); *H01L 2225/06548* (2013.01); *H01L 2225/06562* (2013.01); *H01L 2225/06572* (2013.01); *H01L 2225/06589* (2013.01); *H01L 2924/1533* (2013.01); *H01L 2924/15153* (2013.01); *H01L 2924/15311* (2013.01); *H01L 2924/15313* (2013.01); *H01L 2924/15321* (2013.01); *H01L 2924/18161* (2013.01); *H01L 2924/3025* (2013.01); *H01L 2924/3511* (2013.01); *H01L 2924/37001* (2013.01)

(56) References Cited

U.S. PATENT DOCUMENTS

| | | |
|---|---|---|
| 5,977,640 A | 11/1999 | Bertin et al. |
| 6,084,308 A | 7/2000 | Kelkar et al. |
| 6,091,138 A | 7/2000 | Yu et al. |
| 6,150,724 A | 11/2000 | Wenzel et al. |
| 6,204,562 B1 | 3/2001 | Ho et al. |
| 6,365,963 B1 | 4/2002 | Shimada |
| 6,369,448 B1 | 4/2002 | McCormick |
| 6,376,917 B1 | 4/2002 | Takeshita et al. |
| 6,495,910 B1 | 12/2002 | Wu |
| 6,507,115 B1 | 1/2003 | Hofstee et al. |
| 6,555,917 B1 | 4/2003 | Heo |
| 6,563,205 B1 | 5/2003 | Fogal et al. |
| 6,586,836 B1 | 7/2003 | Ma et al. |
| 6,659,512 B1 | 12/2003 | Harper et al. |
| 6,768,208 B2 | 7/2004 | Lin et al. |
| 6,844,619 B2 | 1/2005 | Tago |
| 6,870,248 B1 | 3/2005 | Shibata |
| 6,906,408 B2 | 6/2005 | Cloud et al. |
| 6,984,544 B2 | 1/2006 | Cloud et al. |
| 7,002,254 B2 | 2/2006 | Harper et al. |
| 7,026,719 B2 | 4/2006 | Wang |
| 7,087,988 B2 | 8/2006 | Hosomi |
| 7,198,980 B2 | 4/2007 | Jiang et al. |
| 7,205,646 B2 | 4/2007 | Lin et al. |
| 7,218,005 B2 | 5/2007 | Tago |
| 7,573,136 B2 | 8/2009 | Jiang et al. |
| 7,592,689 B2 | 9/2009 | Brunnbauer |
| 7,859,120 B2 | 12/2010 | Choi et al. |
| 8,008,121 B2 | 8/2011 | Choi et al. |
| 8,022,555 B2 | 9/2011 | Hwang et al. |
| 8,035,216 B2 | 10/2011 | Skeete |
| 8,143,097 B2 | 3/2012 | Chi et al. |
| 8,148,806 B2 | 4/2012 | Lin et al. |
| 8,227,904 B2 | 7/2012 | Braunisch et al. |
| 8,288,854 B2 | 10/2012 | Weng et al. |
| 8,421,222 B2 | 4/2013 | Lin et al. |
| 8,519,537 B2 | 8/2013 | Jeng et al. |
| 8,525,317 B1 | 9/2013 | Sutardja |
| 8,558,395 B2 | 10/2013 | Khan et al. |
| 8,648,469 B2 | 2/2014 | Choi et al. |
| 8,836,115 B1 | 9/2014 | St. Amand et al. |
| 8,971,053 B2 | 3/2015 | Kariya et al. |
| 9,048,306 B2 | 6/2015 | Chi et al. |
| 9,252,032 B2 | 2/2016 | Choi et al. |
| 9,252,130 B2 | 2/2016 | Kim et al. |
| 9,263,332 B2 | 2/2016 | Chi et al. |
| 9,281,300 B2 | 3/2016 | Merilo et al. |
| 9,305,897 B2 | 4/2016 | Choi et al. |
| 9,337,161 B2 | 5/2016 | Camacho et al. |
| 9,379,078 B2 | 6/2016 | Yu et al. |
| 9,385,095 B2 | 7/2016 | Jeng et al. |
| 2010/0230805 A1* | 9/2010 | Refai-Ahmed ......... H01L 23/10 257/712 |
| 2011/0018114 A1* | 1/2011 | Pagaila ................. H01L 21/561 257/686 |
| 2013/0056862 A1* | 3/2013 | Kim .................... H01L 25/0657 257/692 |
| 2014/0035892 A1* | 2/2014 | Shenoy ................ G09G 3/3266 345/205 |
| 2014/0210107 A1 | 7/2014 | Zhai |
| 2015/0123268 A1* | 5/2015 | Yu ........................... H01L 24/17 257/737 |
| 2015/0303174 A1* | 10/2015 | Yu ...................... H01L 25/0657 257/712 |

* cited by examiner

SEMICONDUCTOR ASSEMBLY WITH ELECTROMAGNETIC SHIELDING AND THERMALLY ENHANCED CHARACTERISTICS AND METHOD OF MAKING THE SAME

CROSS REFERENCE TO RELATED APPLICATIONS

This application is a continuation-in-part of U.S. application Ser. No. 15/166,185 filed May 26, 2016 and continuation-in-part of U.S. application Ser. No. 15/289,126 filed Oct. 8, 2016. The U.S. application Ser. No. 15/166,185 claims the priority benefit of U.S. Provisional Application Ser. No. 62/166,771 filed May 27, 2015. The entirety of each of said Applications is incorporated herein by reference.

FIELD OF THE INVENTION

The present invention relates to a semiconductor assembly and, more particularly, to a semiconductor assembly in which two semiconductor devices are face-to-face mounted together through dual routing circuitries and a heat spreader provides thermal dissipation and electromagnetic shielding, and a method of making the same.

DESCRIPTION OF RELATED ART

Market trends of multimedia devices demand for faster and slimmer designs. One of assembly approaches is to interconnect two semiconductor devices with "face-to-face" configuration so that the routing distance between the two semiconductor devices can be the shortest possible. As the stacked devices can talk directly to each other with reduced latency, the assembly's signal integrity and additional power saving capability are greatly improved. As a result, the face-to-face semiconductor assembly offers almost all of the true 3D IC stacking advantages without the need of expensive through-silicon-via (TSV) in the stacked chips. However, as semiconductor devices are susceptible to performance degradation at high operational temperatures, stacking chips with face-to-face configuration without proper heat dissipation would worsen devices' thermal environment and may cause immediate failure during operation.

Additionally, U.S. Patent Application No. 2014/0210107 discloses stacked chip assembly with face-to-face configuration. Since the bottom chip is not protected and has to be thinner than the solder ball(s) for external connection, the assembly is not reliable and cannot be used in practical applications. U.S. Pat. Nos. 8,008,121, 8,519,537 and 8,558,395 disclose various assembly structures having an interposer disposed in between the face-to-face chips. Although there is no TSV in the stacked chips, the TSV in the interposer that serves for circuitry routing between chips induces complicated manufacturing processes, high yield loss and excessive cost.

For the reasons stated above, and for other reasons stated below, an urgent need exists to provide a new semiconductor assembly that can address high packaging density, better signal integrity and high thermal dissipation requirements.

SUMMARY OF THE INVENTION

The objective of the present invention is to provide a semiconductor assembly with semiconductor devices face-to-face assembled together through a routing circuitry, and has a heat spreader that includes a shielding lid, posts and another routing circuitry. The shielding lid provides electromagnetic shielding and heat dissipation for the chip directly attached thereon, whereas the posts provide heat dissipation channels for the chip that is not directly attached to the shielding lid, and the dual routing circuitries provide staged fan-out routing for the assembly, thereby the combined features of the heat spreader can effectively improve thermal and electrical performances of the assembly.

In accordance with the foregoing and other objectives, the present invention provides a semiconductor assembly having an encapsulated device electrically coupled to a thermally enhanced device. The encapsulated device includes a first semiconductor chip, a first routing circuitry and an encapsulant. The thermally enhanced device includes a second semiconductor chip and a heat spreader. The heat spreader has a shielding lid, posts and a second routing circuitry. In a preferred embodiment, the first semiconductor chip is electrically coupled to one side of the first routing circuitry and sealed in the encapsulant; the second semiconductor chip is electrically coupled to the other side of the first routing circuitry by first bumps, and is disposed in a through opening of the second routing circuitry and thermally conductible to the shielding lid that is grounded by the posts projecting from a surface of the shielding lid and electrically coupled to the first routing circuitry; the first routing circuitry provides primary fan-out routing and the shortest interconnection distance between the first semiconductor chip and the second semiconductor chip; and the second routing circuitry is disposed on the surface of the shielding lid and laterally surrounds the second semiconductor chip and the posts and is electrically coupled to the first routing circuitry to provide further fan-out routing.

In another aspect, the present invention provides a semiconductor assembly with electromagnetic shielding and thermally enhanced characteristics, comprising: an encapsulated device that includes a first semiconductor chip, an encapsulant, and a first routing circuitry disposed on a first surface of the encapsulant, wherein the first semiconductor chip is embedded in the encapsulant and electrically coupled to the first routing circuitry; and a thermally enhanced device that includes a heat spreader and a second semiconductor chip, the heat spreader having a shielding lid, posts and a second routing circuitry disposed over a surface of the shielding lid, wherein (i) the second routing circuitry has a through opening and the second semiconductor chip is disposed in the through opening and attached to the shielding lid, and (ii) the posts project from the surface of the shielding lid and are laterally surrounded by the second routing circuitry; wherein the thermally enhanced device is stacked over the encapsulated device, with the second semiconductor chip electrically coupled to the first routing circuitry by an array of first bumps, and with the second routing circuitry electrically coupled to the first routing circuitry by an array of second bumps.

In yet another aspect, the present invention provides a method of making a semiconductor assembly with electromagnetic shielding and thermally enhanced characteristics, comprising: providing an encapsulated device that includes a first semiconductor chip, an encapsulant, and a first routing circuitry disposed on a first surface of the encapsulant, wherein the first semiconductor chip is embedded in the encapsulant and electrically coupled to the first routing circuitry; electrically coupling a second semiconductor chip to the first routing circuitry of the encapsulated device through an array of first bumps; providing a heat spreader that includes a shielding lid, posts and a second routing circuitry, wherein the second routing circuitry has a through opening and is disposed over a surface of the shielding lid, and the posts project from the surface of the shielding lid and are laterally surrounded by the second routing circuitry; and stacking the heat spreader over the encapsulated device and electrically coupling the second routing circuitry of the heat spreader to the first routing circuitry of the encapsulated device by an array of second bumps, with the second semiconductor chip disposed in the through opening of the second routing circuitry and attached to the shielding lid.

Unless specifically indicated or using the term "then" between steps, or steps necessarily occurring in a certain order, the sequence of the above-mentioned steps is not limited to that set forth above and may be changed or reordered according to desired design.

The semiconductor assembly and the method of making the same according to the present invention have numerous advantages. For instance, face-to-face electrically coupling the encapsulated device and the thermally enhanced device can offer the shortest interconnect distance between the encapsulated device and the thermally enhanced device. Additionally, inserting the second semiconductor chip into the through opening of the second routing circuitry on the shielding lid is beneficial as the shielding lid of the heat spreader can provide thermal dissipation for the second semiconductor chip and serve as a support platform for the assembly, whereas the posts of the heat spreader can provide electrical connection between the shielding lid and the first routing circuitry for ground connection so as to offer effective EMI shielding for the second semiconductor chip.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Figure 1:
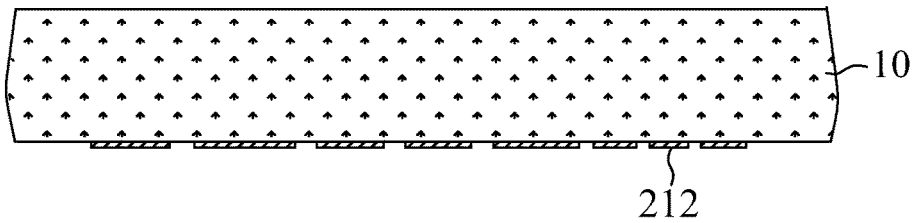
FIG. 1 is a cross-sectional view of the structure with routing traces formed on a sacrificial carrier in accordance with the first embodiment of the present invention.

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-20 are schematic views showing a method of making a semiconductor assembly that includes a first routing circuitry 21, a first semiconductor chip 22, an array of terminals 24, an encapsulant 25, a heat spreader 31 and a second semiconductor chip 36 in accordance with the first embodiment of the present invention.

FIG. 1 is a cross-sectional view of the structure with routing traces 212 formed on a sacrificial carrier 10 by metal deposition and metal patterning process. In this illustration, the sacrificial carrier 10 is a single-layer structure. The sacrificial carrier 10 typically is made of copper, aluminum, iron, nickel, tin, stainless steel, silicon, or other metals or alloys, but any other conductive or non-conductive material also may be used. In this embodiment, the sacrificial carrier 10 is made of an iron-based material. The routing traces 212 typically are made of copper and can be pattern deposited by numerous techniques, such as electroplating, electroless plating, evaporating, sputtering or their combinations, or be thin-film deposited followed by a metal patterning process. For a conductive sacrificial carrier 10, the routing traces 212 are deposited typically by plating of metal. The metal patterning techniques include wet etching, electro-chemical etching, laser-assist etching, and their combinations with an etch mask (not shown) thereon that defines the routing traces 212.

Figure 2:
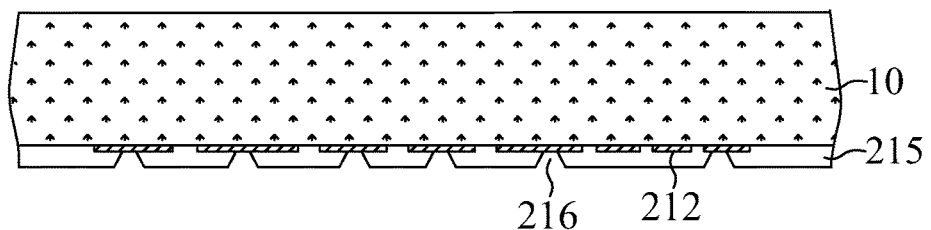
FIG. 2 is a cross-sectional view of the structure of FIG. 1 further provided with a dielectric layer and via openings in accordance with the first embodiment of the present invention.

FIG. 2 is a cross-sectional view of the structure with a dielectric layer 215 on the sacrificial carrier 10 as well as the routing traces 212 and via openings 216 in the dielectric layer 215. The dielectric layer 215 is deposited typically by lamination or coating, and contacts and covers and extends laterally on the sacrificial carrier 10 and the routing traces 212 from below. The dielectric layer 215 typically has a thickness of 50 microns, and can be made of epoxy resin, glass-epoxy, polyimide, or the like. After the deposition of the dielectric layer 215, the via openings 216 are formed by numerous techniques, such as laser drilling, plasma etching and photolithography, and typically have a diameter of 50 microns. Laser drilling can be enhanced by a pulsed laser. Alternatively, a scanning laser beam with a metal mask can be used. The via openings 216 extend through the dielectric layer 215 and are aligned with selected portions of the routing traces 212.

Figure 3:
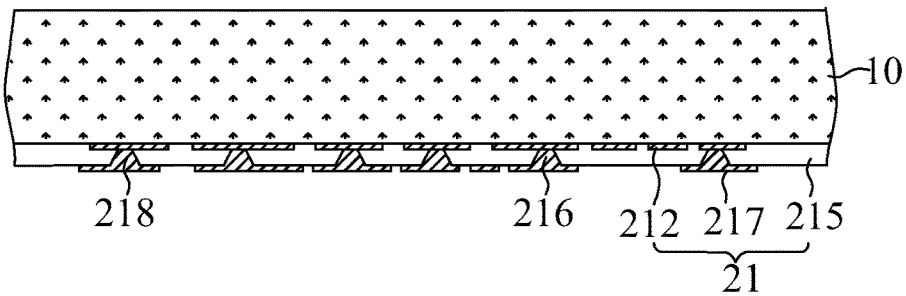
FIG. 3 is a cross-sectional view of the structure of FIG. 2 further provided with first conductive traces in accordance with the first embodiment of the present invention.

Referring now to FIG. 3, first conductive traces 217 are formed on the dielectric layer 215 by metal deposition and metal patterning process. The first conductive traces 217 extend from the routing traces 212 in the downward direction, fill up the via openings 216 to form metallized vias 218 in direct contact with the routing traces 212, and extend laterally on the dielectric layer 215. As a result, the first conductive traces 217 can provide horizontal signal routing in both the X and Y directions and vertical routing through the via openings 216 and serve as electrical connections for the routing traces 212.

The first conductive traces 217 can be deposited as a single layer or multiple layers by any of numerous techniques, such as electroplating, electroless plating, evaporating, sputtering, or their combinations. For instance, they can be deposited by first dipping the structure in an activator solution to render the dielectric layer 215 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first conductive traces 217 by any of numerous techniques such as wet etching, electro-chemical etching, laser-assist etching, or their combinations, with an etch mask (not shown) thereon that defines the first conductive traces 217.

At this stage, the formation of a first routing circuitry 21 on the sacrificial carrier 10 is accomplished. In this illustration, the first routing circuitry 21 is a multi-layered buildup circuitry and includes routing traces 212, a dielectric layer 215 and first conductive traces 217.

Figure 4:
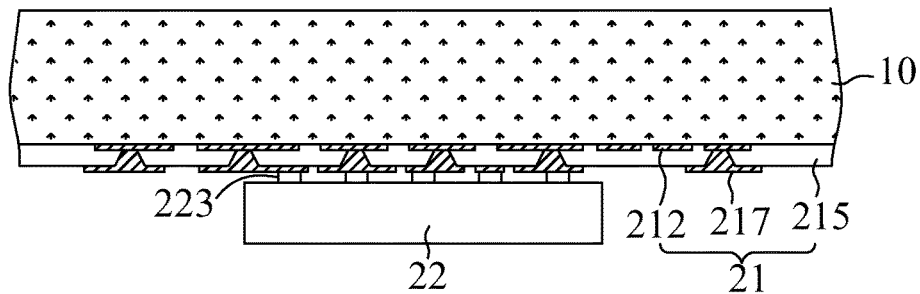
FIG. 4 is a cross-sectional view of the structure of FIG. 3 further provided with first semiconductor chip in accordance with the first embodiment of the present invention.

FIG. 4 is a cross-sectional view of the structure with a first semiconductor chip 22 electrically coupled to the first routing circuitry 21. The first semiconductor chip 22, illustrated as a bare chip, can be electrically coupled to the first conductive traces 217 of the first routing circuitry 21 using conductive bumps 223 in contact with the first semiconductor chip 22 and the first routing circuitry 21 by thermal compression, solder reflow or thermosonic bonding.

Figure 5:
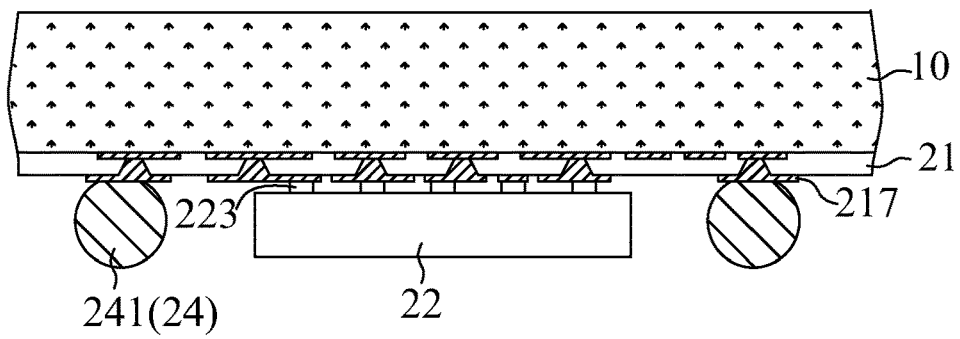
FIG. 5 is a cross-sectional view of the structure of FIG. 4 further provided with solder balls in accordance with the first embodiment of the present invention.

FIG. 5 is a cross-sectional view of the structure with solder balls 241 on the first routing circuitry 21. The solder balls 241 are electrically connected to and contact the first conductive traces 217 of the first routing circuitry 21 to serve as terminals 24 around the first semiconductor chip 22.

Figure 6:
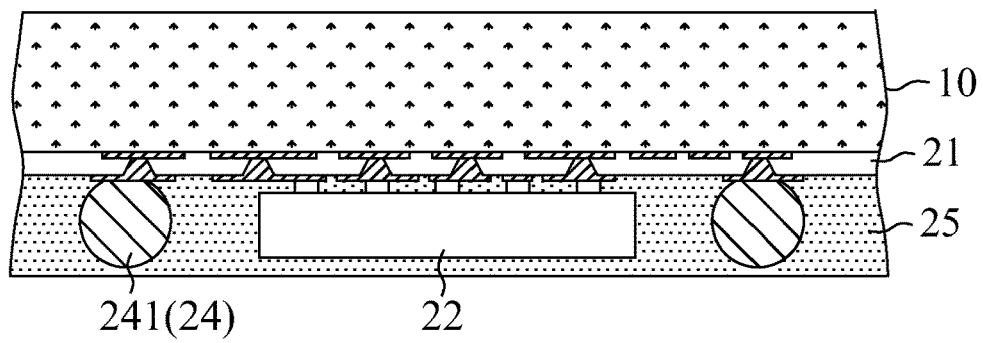
FIG. 6 is a cross-sectional view of the structure of FIG. 5 further provided with an encapsulant in accordance with the first embodiment of the present invention.

FIG. 6 is a cross-sectional view of the structure with an encapsulant 25 on the first routing circuitry 21, the first semiconductor chip 22 and the solder balls 241 by, for example, resin-glass lamination, resin-glass coating or molding. The encapsulant 25 covers the first routing circuitry 21, the first semiconductor chip 22 and the solder balls 241 from below and surrounds and conformally coats and covers sidewalls of the first semiconductor chip 22 and the solder balls 241.

Figure 7:
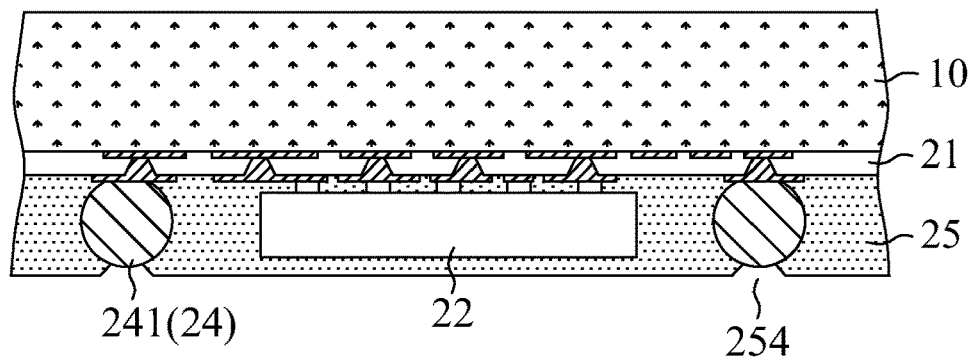
FIG. 7 is a cross-sectional view of the structure of FIG. 6 further provided with openings in accordance with the first embodiment of the present invention.

FIG. 7 is a cross-sectional view of the structure provided with openings 254 in the encapsulant 25. The openings 254 are aligned with the solder balls 241 to expose selected portions of the solder balls 241 from below.

Figure 8:
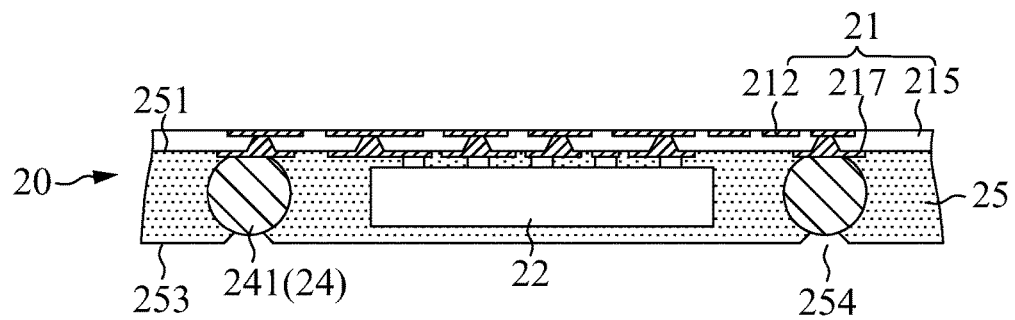
FIGS. 8 and 9 are cross-sectional and top perspective views, respectively, of the structure of FIG. 7 after removal of the sacrificial carrier in accordance with the first embodiment of the present invention.
Figure 9:
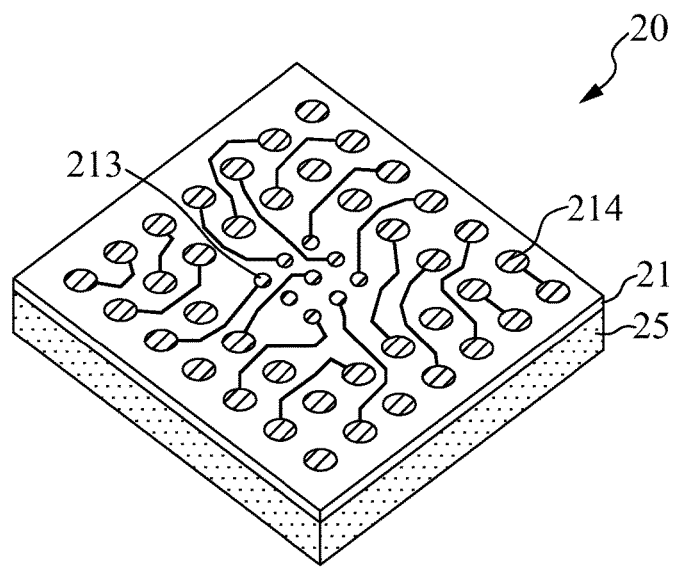

FIGS. 8 and 9 are cross-sectional and top perspective views, respectively, of the structure after removal of the sacrificial carrier 10. The sacrificial carrier 10 can be removed to expose the first routing circuitry 21 from above by numerous techniques, such as wet chemical etching using acidic solution (e.g., ferric chloride, copper sulfate solutions), or alkaline solution (e.g., ammonia solution), electro-chemical etching, or mechanical process such as a drill or end mill followed by chemical etching. In this embodiment, the sacrificial carrier 10 made of an iron-based material is removed by a chemical etching solution that is selective between copper and iron so as to prevent the copper routing traces 212 from being etched during removal of the sacrificial carrier 10. Accordingly, the first routing circuitry 21 adjacent to the first surface 251 of the encapsulant 25 can provide electrical contacts in the upward direction, whereas the solder balls 241 exposed from the second surface 253 of the encapsulant 25 can provide electrical contacts for next-level connection in the downward direction. As shown in FIG. 9, the routing traces 212 include first contact pads 213 and second contact pads 214. The second contact pads 214 have larger pad size and pitch than those of the first contact pads 213. As a result, the first contact pads 213 can provide electrical contacts for another semiconductor chip, whereas the second contact pads 214 can provide electrical contacts for a next level interconnect structure.

At this stage, an encapsulated device 20 is accomplished and includes a first routing circuitry 21, a first semiconductor chip 22, an array of terminals 24, and an encapsulant 25.

Figure 10:
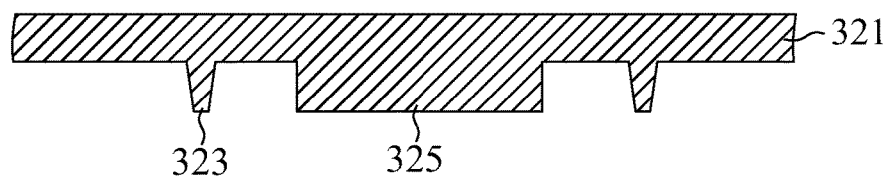
FIGS. 10 and 11 are cross-sectional and bottom perspective views, respectively, of the structure with a protruded platform and posts projecting from a shielding lid in accordance with the first embodiment of the present invention.
Figure 11:
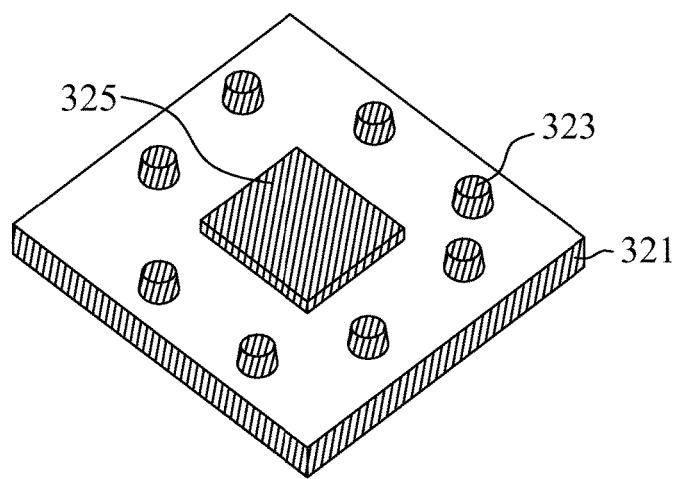

FIGS. 10 and 11 are cross-sectional and bottom perspective views, respectively, of the structure having a shielding lid 321, an array of posts 323 and a protruded platform 325. The shielding lid 321, the posts 323 and the protruded platform 325 typically are integrated as one piece and can be made of any material used for thermal dissipation and electromagnetic interference (EMI) shielding, such as copper, aluminum, stainless steel, or other metals or alloys. In this embodiment, the shielding lid 321, the posts 323 and the protruded platform 325 are made of copper. The posts 323 and the protruded platform 325 project from a surface of the shielding lid 321 and typically are formed by photolithography and wet etching.

Figure 12:
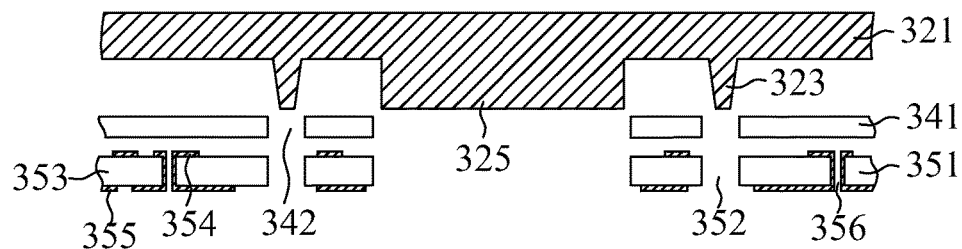
FIG. 12 is a cross-sectional view of the structure of FIG. 10 further provided with a binding film and a routing substrate in accordance with the first embodiment of the present invention.
Figure 13:
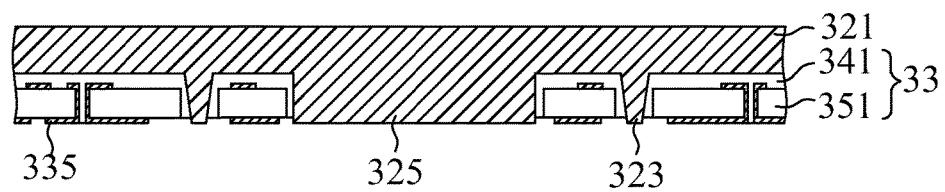
FIG. 13 is a cross-sectional view of the structure of FIG. 12 further subjected to a lamination process in accordance with the first embodiment of the present invention.

FIGS. 12-13 are cross-sectional views showing a process of laminating a routing substrate 351 on the shielding lid 321 using a binding film 341. The lamination process is executed by inserting the posts 323 and the protruded platform 325 into apertures 352 of the routing substrate 351 as well as openings 342 of the binding film 341. The openings 342 and the apertures 352 typically are formed by laser cutting through the binding film 341 and the routing substrate 351, respectively, and also may be formed by other techniques such as punching or mechanical drilling. The binding film 214 can be various dielectric films or prepregs formed from numerous organic or inorganic electrical insulators. In this illustration, the routing substrate 351 is a laminate that includes an insulating layer 353, second conductive traces 354, third conductive traces 355, and metallized holes 356. The insulating layer 353 typically has a thickness of 50 microns, and can be made of epoxy resin, glass-epoxy, polyimide, or the like. The second conductive traces 354 and the third conductive traces 355 are disposed on opposite sides of the insulating layer 353. The metallized holes 356 extend through the insulating layer 353 and are electrically coupled to the second conductive traces 354 and the third conductive traces 355.

Under heat and pressure, the binding film 341 between the shielding lid 321 and the routing substrate 351 is melted and forced into gaps between the posts 323 and the routing substrate 351 and between the protruded platform 325 and the routing substrate 351. As a result, the shielding lid 321, the posts 323 and the protruded platform 325 are spaced from the routing substrate 351 by the binding film 341. The binding film 341 when solidified provides secure robust mechanical bonds between the shielding lid 321 and the routing substrate 351, between the posts 323 and the routing substrate 351, and between the protruded platform 325 and the routing substrate 351.

At this stage, the formation of a second routing circuitry 33 on the shielding lid 321 is accomplished, and includes a binding film 341 and a routing substrate 351. In this illustration, the posts 323 and the protruded platform 325 extend through the second routing circuitry 33, and each has an exposed surface substantially coplanar with the exterior surface of the third conductive traces 355 of the routing substrate 351 in the downward direction.

Figure 14:
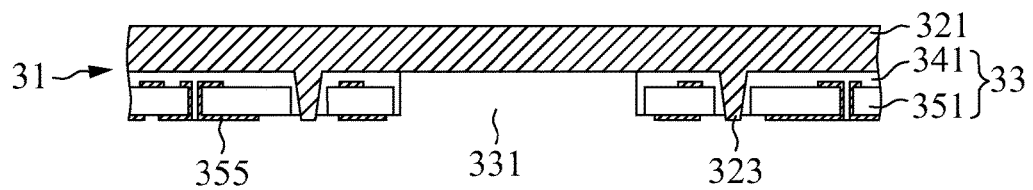
FIGS. 14 and 15 are cross-sectional and bottom perspective views, respectively, of the structure of FIG. 13 further formed with a cavity to finish the fabrication of a heat spreader in accordance with the first embodiment of the present invention.
Figure 15:
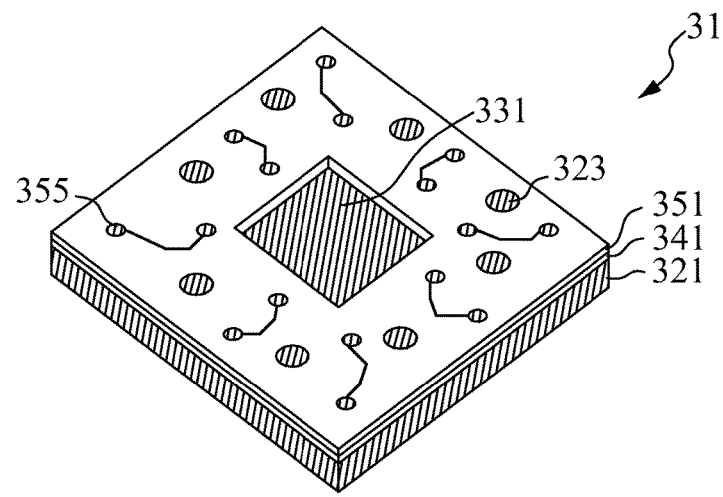

FIGS. 14 and 15 are cross-sectional and bottom perspective views, respectively, of the structure with a selected portion of the shielding lid 321 exposed from below by removing the protruded platform 325. The protruded platform 325 can be removed to expose the selected portion of the shielding lid 321 from a through opening 331 of the second routing circuitry 33 by numerous techniques, such as wet chemical etching using acidic solution (e.g., ferric chloride, copper sulfate solutions), or alkaline solution (e.g., ammonia solution), electro-chemical etching, or mechanical process such as a drill or end mill followed by chemical etching.

At this stage, a heat spreader 31 is accomplished and includes a shielding lid 321, an array of posts 323 and a second routing circuitry 33. In this illustration, the shielding lid 321 is partially exposed from the through opening 331 of the second routing circuitry 33 and the posts 323 are formed along a periphery of the through opening 331 of the second routing circuitry 33.

Figure 16:
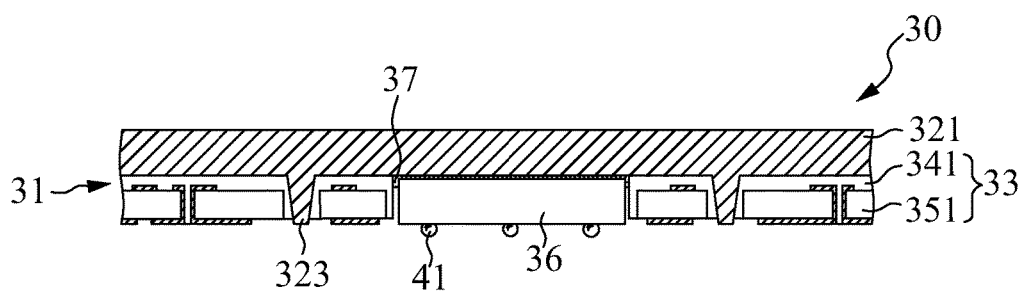
FIG. 16 is a cross-sectional view of the structure of FIG. 14 further provided with second semiconductor chip having first bumps thereon in accordance with the first embodiment of the present invention.

FIG. 16 is a cross-sectional view of the structure with a second semiconductor chip 36 attached to the heat spreader 31. The second semiconductor chip 36, illustrated as a bare chip, is provided with first bumps 41 on its active surface and thermally conductible to the shielding lid 321 of the heat spreader 31 by a thermally conductive contact element 37 in contact with its inactive surface. The thermally conductive contact element 37 may be made of solder or organic resin having blended metal particles. As a result, the heat spreader 31 can provide thermal dissipation for the second semiconductor chip 36 face-down disposed within the through opening 331 of the second routing circuitry 33.

At this stage, a thermally enhanced device 30 is accomplished and includes a heat spreader 31 and a second semiconductor chip 36.

Figure 17:
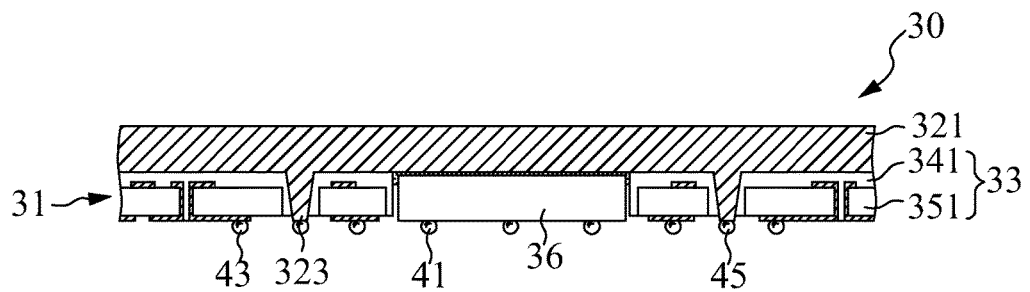
FIG. 17 is a cross-sectional view of the structure of FIG. 16 further provided with second bumps and third bumps in accordance with the first embodiment of the present invention.

FIG. 17 is a cross-sectional view of the structure with second bumps 43 and third bumps 45 mounted on the heat spreader 31. The second bumps 43 and the third bumps 45 contact and are electrically coupled to the second routing circuitry 33 and the posts 323 of the heat spreader 31, respectively.

Figure 18:
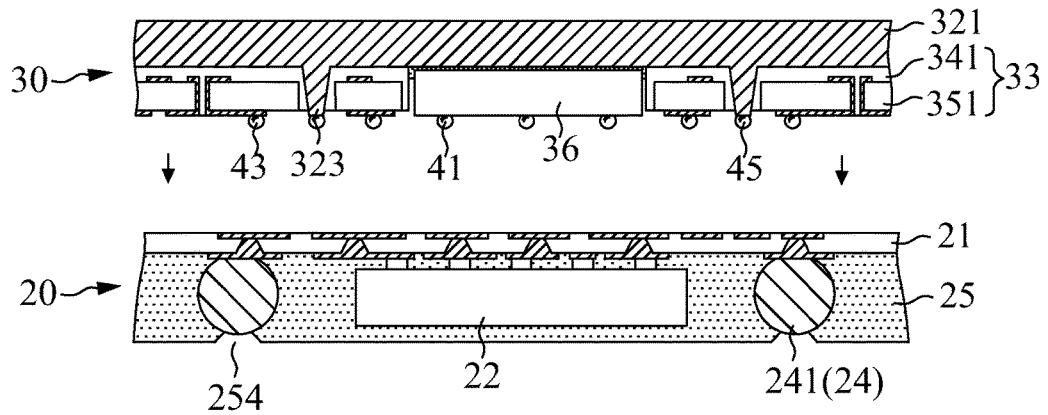
FIG. 18 is a cross-sectional view showing the step of stacking the structure of FIG. 17 on the structure of FIG. 8 in accordance with the first embodiment of the present invention.

FIG. 18 is a cross-sectional view showing the step of stacking the thermally enhanced device 30 of FIG. 17 on the encapsulated device 20 of FIG. 8. In this illustration, the first semiconductor chip 22 is placed face-up, whereas the second semiconductor chip 36 is placed face-down.

Figure 19:
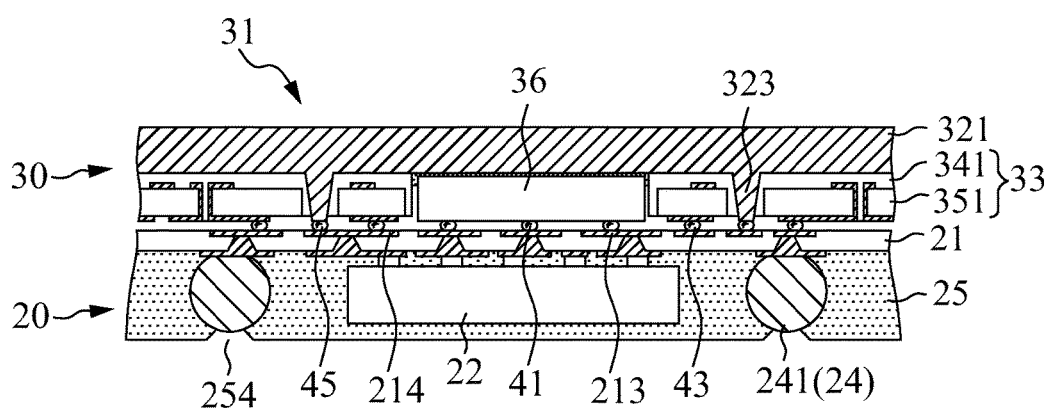
FIG. 19 is a cross-sectional view of the structure of FIG. 17 electrically coupled to the structure of FIG. 8 in accordance with the first embodiment of the present invention.

FIG. 19 is a cross-sectional view of the structure with the second semiconductor chip 36 and the heat spreader 31 electrically coupled to the first routing circuitry 21. The first bumps 41 contact and are electrically coupled to the first contact pads 213 of the first routing circuitry 21 to provide electrical connections between the first routing circuitry 21 and the second semiconductor chip 36. The second bumps 43 and the third bumps 45 contact and are electrically coupled to the second contact pads 214 of the first routing circuitry 21 to provide electrical connections between the first routing circuitry 21 and the second routing circuitry 33 and between the first routing circuitry 21 and the posts 323.

Figure 20:
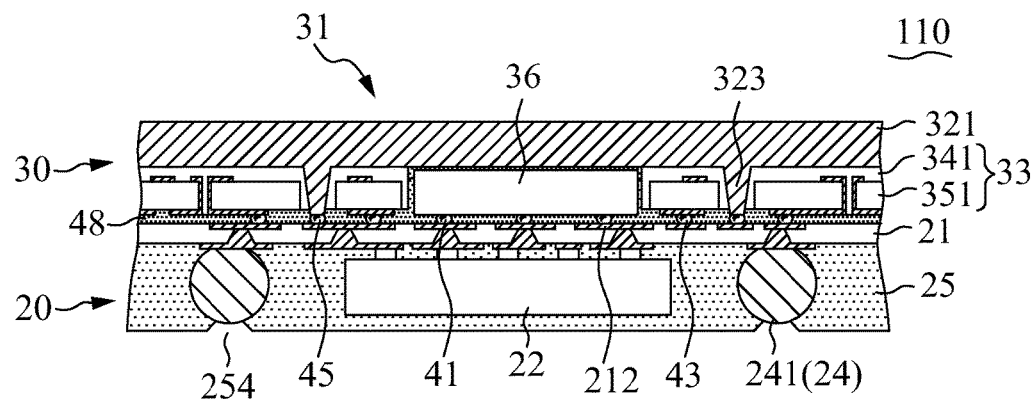
FIG. 20 is a cross-sectional view of the structure of FIG. 19 further provided with a resin to finish the fabrication of a semiconductor assembly in accordance with the first embodiment of the present invention.

FIG. 20 is a cross-sectional view of the structure provided with a resin 48 between the encapsulated device 20 and the thermally enhanced device 30. Optionally, the resin 48 can be further provided to fill in the space between the first routing circuitry 21 and the second routing circuitry 33 and between the first routing circuitry 21 and the second semiconductor chip 36, and fill up the gap located in the through opening 331 between the second semiconductor chip 36 and sidewalls of the through opening 331.

Accordingly, as shown in FIG. 20, a semiconductor assembly 110 is accomplished and includes an encapsulated device 20 and a thermally enhanced device 30. The thermally enhanced device 30 is stacked over and face-to-face electrically coupled to the encapsulated device 20 by an array of first bumps 41, an array of second bumps 43, and an array of third bumps 45. In this illustration, the encapsulated device 20 includes a first routing circuitry 21, a first semiconductor chip 22, an array of terminals 24 and an encapsulant 25, whereas the thermally enhanced device 30 includes a heat spreader 31 and a second semiconductor chip 36.

The first semiconductor chip 22 is embedded in the encapsulant 25 and flip-chip electrically coupled to the first routing circuitry 21 from one side of the first routing circuitry 21. The terminals 24 surround the first semiconductor chip 22 and are electrically coupled to the first routing circuitry 21 and laterally covered by the encapsulant 25. The second semiconductor chip 36 is spaced from and flip-chip electrically coupled to the first routing circuitry 21 by the first bumps 41 from the other side of the first routing circuitry 21. As such, the first routing circuitry 21 offers primary fan-out routing and the shortest interconnection distance between the first semiconductor chip 22 and the second semiconductor chip 36. The heat spreader 31 has a shielding lid 321, posts 323 projecting from a surface of the shielding lid 321, and a second routing circuitry 33 on the surface of the shielding lid 321. The shielding lid 321 of the heat spreader 31 is thermally conductible to and covers the second semiconductor chip 36 from above. The second routing circuitry 33 is electrically coupled to and spaced from the first routing circuitry 21 by the second bumps 43. The posts 323 laterally surround the second semiconductor chip 36 and extend through the second routing circuitry 33. For ground connection, the shielding lid 321 and the posts 323 are electrically connected to the terminals 24 in the encapsulant 25 through the first routing circuitry 21 and the third bumps 45 in contact with the posts 323 and the first routing circuitry 21. As a result, the shielding lid 321 provides dissipation and EMI shielding for the second semiconductor chip 36, whereas the posts 323 can serve as heat pipes to provide heat dissipation for the first semiconductor chip 22.

Figure 21:
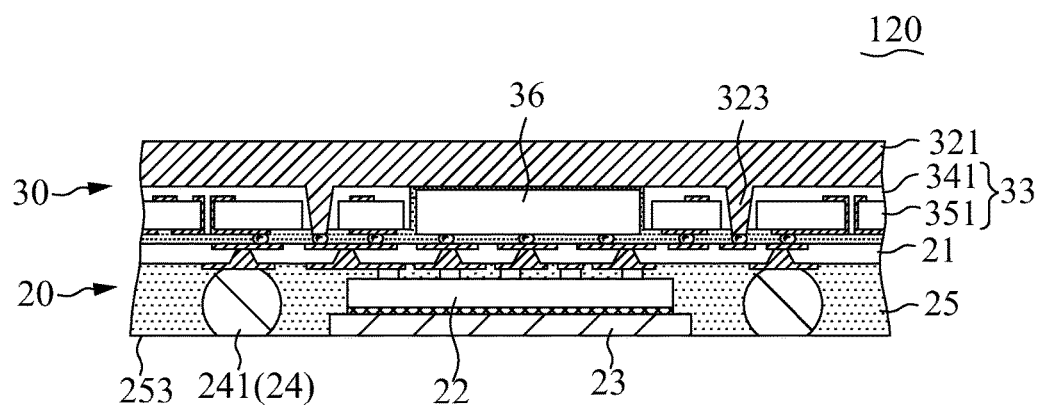
FIG. 21 is a cross-sectional view of another aspect of the semiconductor assembly in accordance with the first embodiment of the present invention.

FIG. 21 is a cross-sectional view of another aspect of the semiconductor assembly according to the first embodiment of the present invention. The semiconductor assembly 120 includes another heat spreader 23 attached to the first semiconductor chip 22. The semiconductor assembly 120 is similar to that illustrated in FIG. 20, except that the encapsulated device 20 further includes the heat spreader 23 and the terminals 24 have an exposed surface substantially coplanar with the second surface 253 of the encapsulant 25. The heat spreader 23 typically is made of a thermally conductive material, such as metal, alloy, silicon, ceramic or graphite. In this aspect, the heat spreader 23 is attached to an inactive surface of the first semiconductor chip 22 before the provision of the encapsulant 25 and is exposed from the second surface 253 of the encapsulant 25, whereas the solder balls 241 extend from the first routing circuitry 21 to the second surface 253 of the encapsulant 25 and serve as the terminals 24.

Figure 22:
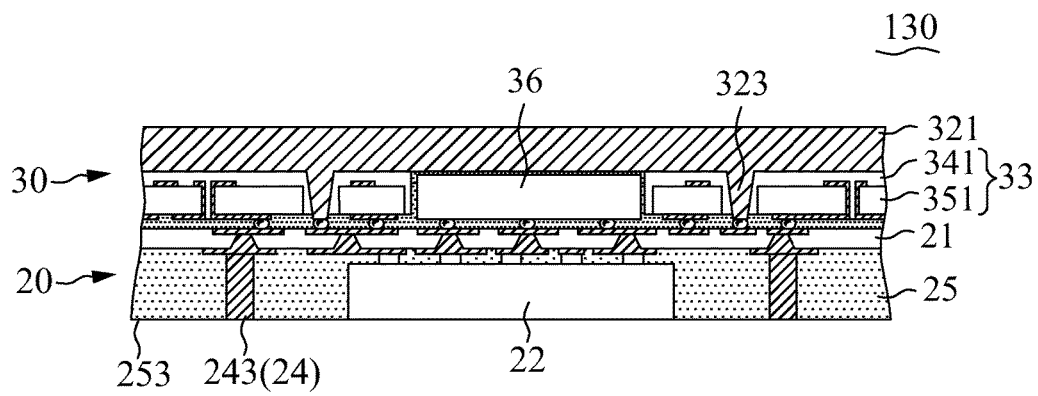
FIG. 22 is a cross-sectional view of yet another aspect of the semiconductor assembly in accordance with the first embodiment of the present invention.

FIG. 22 is a cross-sectional view of yet another aspect of the semiconductor assembly according to the first embodiment of the present invention. The semiconductor assembly 130 has metal pillars 243 as the terminals 24. The semiconductor assembly 130 is similar to that illustrated in FIG. 20, except that the encapsulated device 20 includes the metal pillars 243 as the terminals 24. The metal pillars 243 are provided before the formation of the encapsulant 25, and extend from the first routing circuitry 21 to the second surface 253 of the encapsulant 25.

Embodiment 2

FIGS. 23-31 are schematic views showing a method of making a semiconductor assembly with an external routing circuitry on the encapsulant in accordance with the second embodiment of the present invention.

For purposes of brevity, any description in Embodiment 1 above is incorporated herein insofar as the same is applicable, and the same description need not be repeated.

Figure 23:
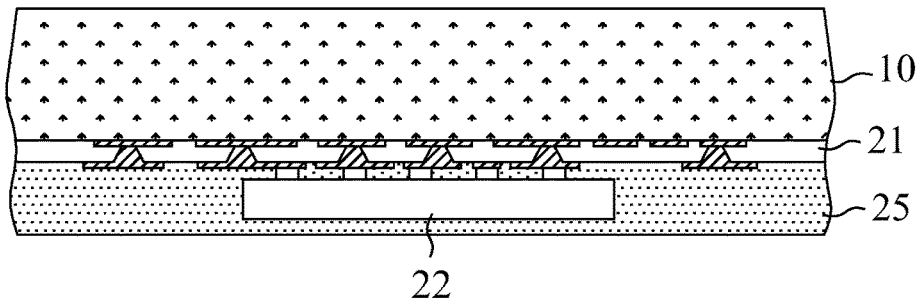
FIG. 23 is a cross-sectional view of the structure of FIG. 4 further provided with an encapsulant in accordance with the second embodiment of the present invention.

FIG. 23 is a cross-sectional view of the structure with an encapsulant 25 on the first routing circuitry 21 and the first semiconductor chip 22 of FIG. 4. The encapsulant 25 covers the first routing circuitry 21 and the first semiconductor chip 22 from below and surrounds and conformally coats and covers sidewalls of the first semiconductor chip 22.

Figure 24:
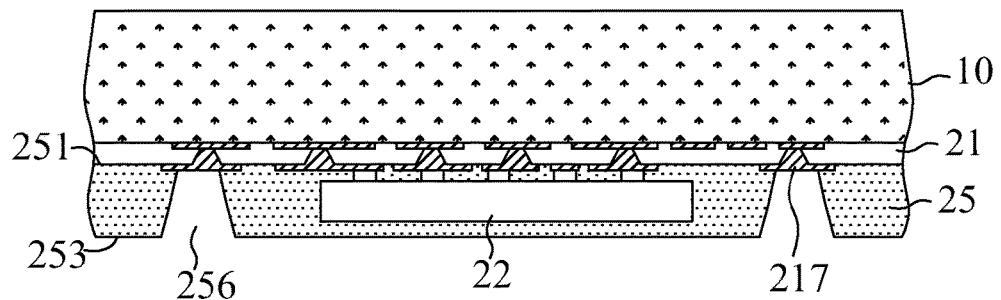
FIG. 24 is a cross-sectional view of the structure of FIG. 23 further provided with via openings in accordance with the second embodiment of the present invention.

FIG. 24 is a cross-sectional view of the structure with via openings 256 in the encapsulant 25. The via openings 256 are aligned with selected portions of the first conductive traces 217 of the first routing circuitry 21 and extend through the encapsulant 25 between the first surface 251 and the second surface 253 of the encapsulant 25.

Figure 25:
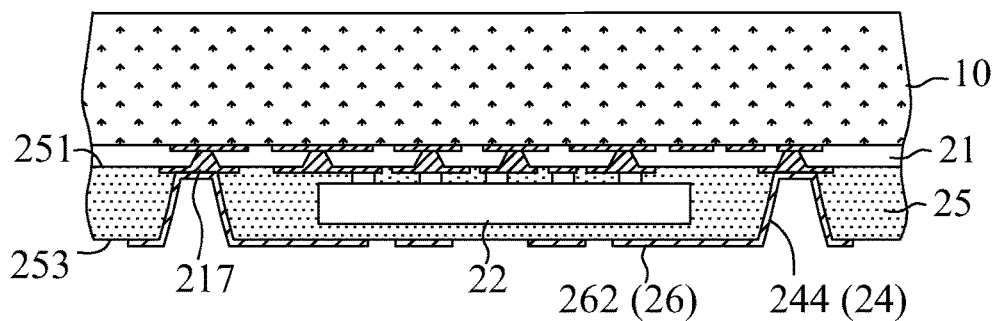
FIG. 25 is a cross-sectional view of the structure of FIG. 24 further provided with conductive vias and exterior conductive traces in accordance with the second embodiment of the present invention.

FIG. 25 is a cross-sectional view of the structure provided with conductive vias 244 in the via openings 256 and exterior conductive traces 262 on the encapsulant 25. The conductive vias 244 are formed by metal deposition in the via openings 256 and contact the first conductive traces 217 of the first routing circuitry 21 to serve as terminals 24 around the first semiconductor chip 22. The exterior conductive traces 262 are formed on the second surface 253 of the encapsulant 25 by metal deposition and metal patterning process and electrically coupled to the conductive vias 244.

At this stage, the formation of an external routing circuitry 26 on the second surface 253 of the encapsulant 25 is accomplished. In this illustration, the external routing circuitry 26 includes exterior conductive traces 262 that laterally extend on the second surface 253 of the encapsulant 25 and contact and are electrically coupled to the terminals 24 in the encapsulant 25.

Figure 26:
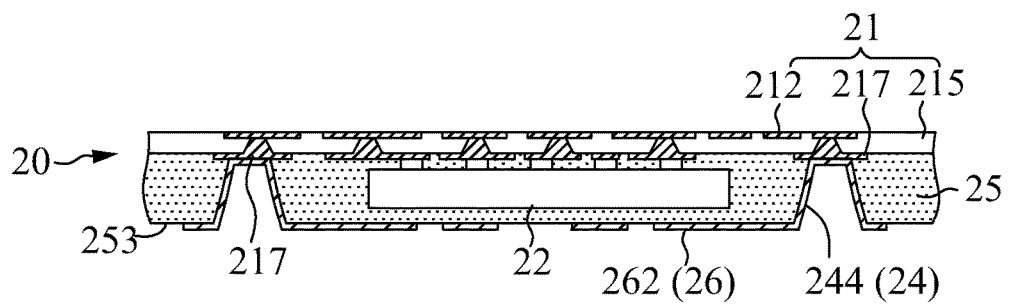
FIGS. 26 and 27 are cross-sectional and top perspective views, respectively, of the structure of FIG. 25 after removal of the sacrificial carrier in accordance with the second embodiment of the present invention.
Figure 27:
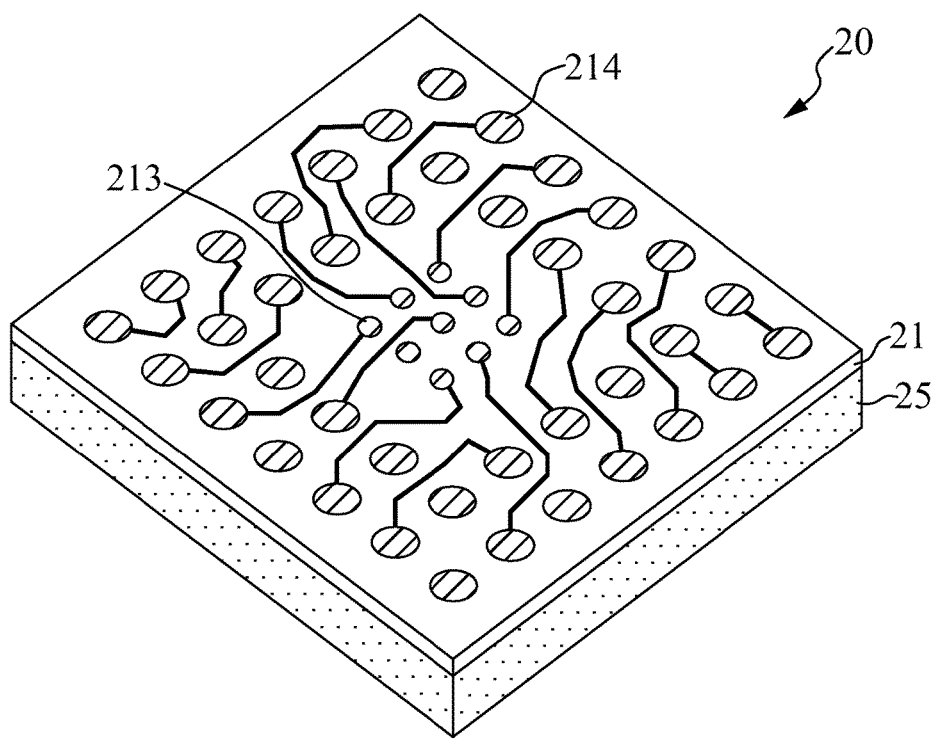

FIGS. 26 and 27 are cross-sectional and top perspective views, respectively, of the structure with the first routing circuitry 21 exposed above by removing the sacrificial carrier 10. As shown in FIG. 27, the routing traces 212 include first contact pads 213 and second contact pads 214. The second contact pads 214 have larger pad size and pitch than those of the first contact pads 213. At this stage, an encapsulated device 20 is accomplished and includes a first routing circuitry 21, a first semiconductor chip 22, an array of terminals 24, an encapsulant 25, and an external routing circuitry 26.

Figure 28:
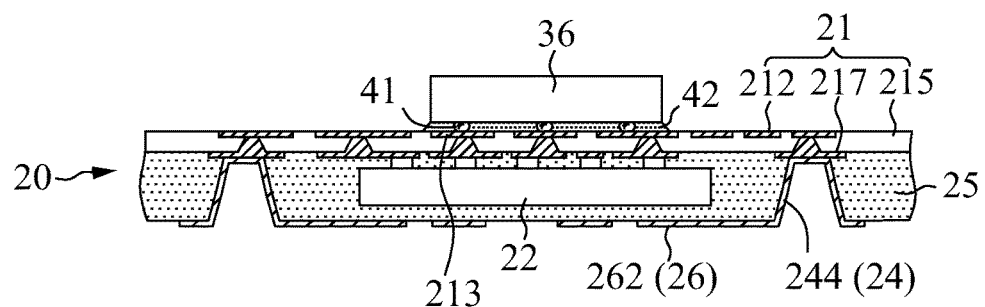
FIGS. 28 and 29 are cross-sectional and top perspective views, respectively, of the structure of FIG. 26 further provided with a second semiconductor chip in accordance with the second embodiment of the present invention.
Figure 29:
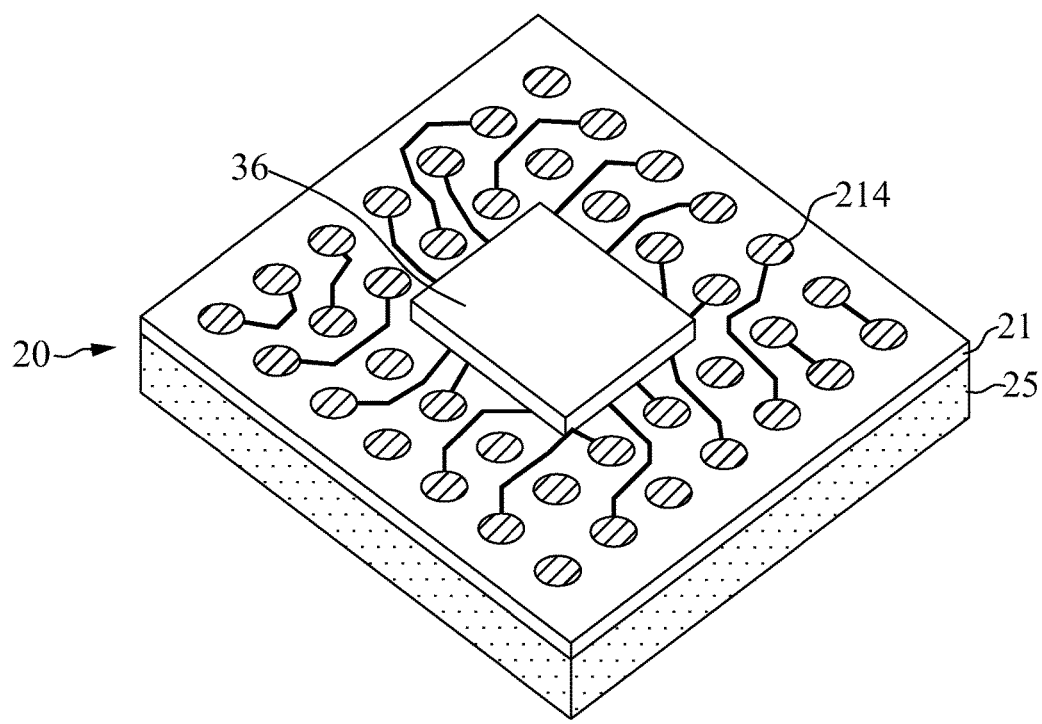

FIGS. 28 and 29 are cross-sectional and top perspective views, respectively, of the structure with a second semiconductor chip 36 electrically coupled to the first routing circuitry 21. The second semiconductor chip 36 is flip-chip mounted to the first routing circuitry 21 by an array of first bumps 41 in contact with the first contact pads 213 of the first routing circuitry 21. Optionally, underfill 42 can be further provided to fill the gap between the first routing circuitry 21 and the second semiconductor chip 36.

Figure 30:
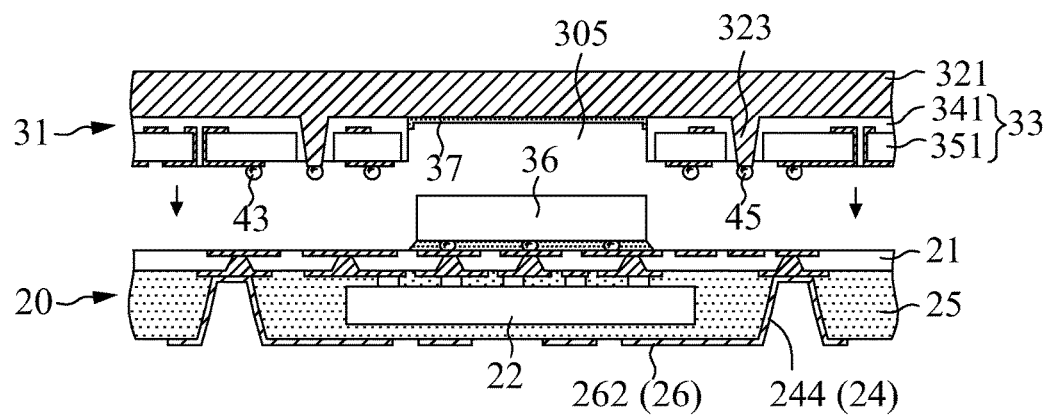
FIG. 30 is a cross-sectional view showing the step of stacking the heat spreader of FIG. 14 on the structure of FIG. 28 in accordance with the second embodiment of the present invention.

FIG. 30 is a cross-sectional view showing the step of stacking the heat spreader 31 of FIG. 14 on the structure of FIG. 28. Before the stacking process, a thermally conductive contact element 37 is dispensed on the shielding lid 321 exposed from the cavity 305 of the heat spreader 31, and an array of second bumps 43 and third bumps 45 are mounted on the second routing circuitry 33 and the posts 323 of the heat spreader 31, respectively.

Figure 31:
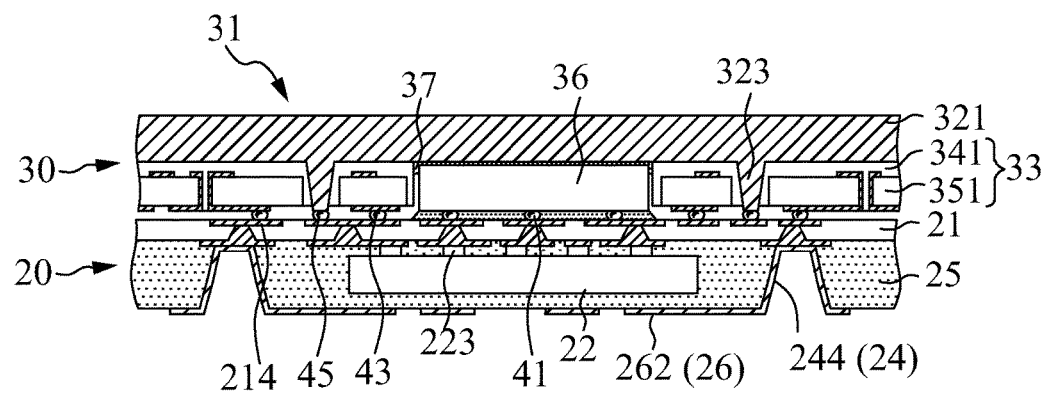
FIG. 31 is a cross-sectional view of the heat spreader of FIG. 14 electrically coupled to the structure of FIG. 28 to finish the fabrication of a semiconductor assembly in accordance with the second embodiment of the present invention.

FIG. 31 is a cross-sectional view of the structure with the heat spreader 31 attached to the second semiconductor chip 36 and electrically coupled to the first routing circuitry 21. The second semiconductor chip 36 is inserted into the cavity 305 of the heat spreader 31 and thermally conductible to the shielding lid 321 of the heat spreader 31 by the thermally conductive contact element 37. The second routing circuitry 33 and the posts 323 of the heat spreader 31 are electrically coupled to the first routing circuitry 21 by the second bumps 43 and the third bumps 45 in contact with the second contact pads 214, respectively.

Accordingly, as shown in FIG. 31, a semiconductor assembly 210 is accomplished and includes an encapsulated device 20 and a thermally enhanced device 30. In this illustration, the encapsulated device 20 includes a first routing circuitry 21, a first semiconductor chip 22, an array of terminals 24, an encapsulant 25 and an external routing circuitry 26, whereas the thermally enhanced device 30 includes a heat spreader 31 and a second semiconductor chip 36.

The first semiconductor chip 22 and the second semiconductor chip 36 are disposed at two opposite sides of the first routing circuitry 21 and face-to-face electrically connected to each other through the first routing circuitry 21 therebetween. The first semiconductor chip 22 is embedded in the encapsulant 25 and surrounded by the terminals 24 and electrically coupled to the first routing circuitry 21 by conductive bumps 223. The second semiconductor chip 36 is accommodated in the cavity 305 of the heat spreader 31 and electrically coupled to and spaced from the first routing circuitry 21 by first bumps 41. The heat spreader 31 has a shielding lid 321 thermally conductible to the second semiconductor chip 36, an array of posts 323 projecting from the shielding lid 321, and a second routing circuitry 33 disposed on the shielding lid 321. The shielding lid 321 is electrically coupled to the first routing circuitry 21 and the terminals 24 for ground connection through the posts 323 in electrical connection with the first routing circuitry 21. Accordingly, the shielding lid 321 can provide thermal dissipation, electromagnetic shielding and moisture barrier for the second semiconductor chip 36. The second routing circuitry 33 is electrically coupled to the first routing circuitry 21 through second bumps 43, whereas the external routing circuitry 26 is electrically coupled to the first routing circuitry 21 through the terminals 24 in the encapsulant 25. As a result, the first routing circuitry 21, the second routing circuitry 33 and the external routing circuitry 26 are electrically connected to each other, and provide staged fan-out routing for the first semiconductor chip 22 and the second semiconductor chip 36.

Figure 32:
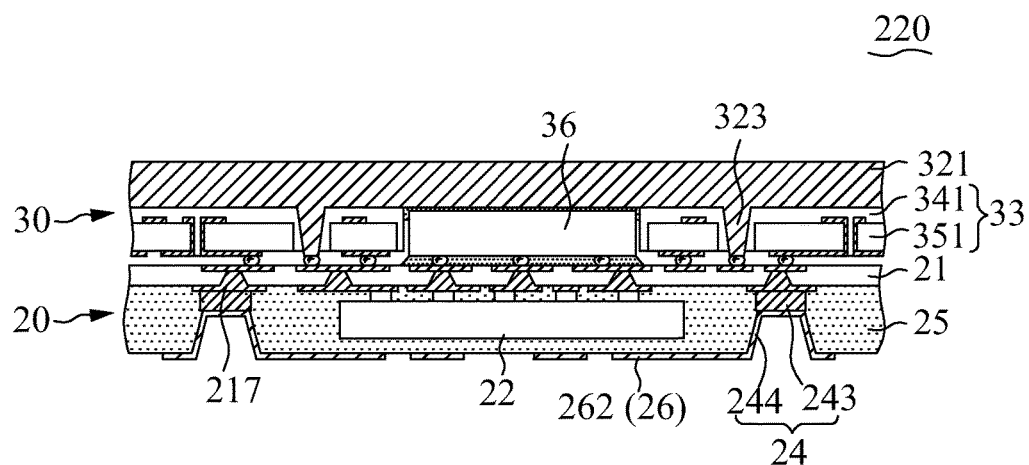
FIG. 32 is a cross-sectional view of another aspect of the semiconductor assembly in accordance with the second embodiment of the present invention.

FIG. 32 is a cross-sectional view of another aspect of the semiconductor assembly according to the second embodiment of the present invention. The semiconductor assembly 220 has a combination of metal pillars 243 and conductive vias 244 as the terminals 24. The semiconductor assembly 220 is similar to that illustrated in FIG. 31, except that the encapsulated device 20 further includes metal pillars 243 between the first routing circuitry 21 and the conductive vias 244. The metal pillars 243 contact the first conductive traces 217, and the conductive vias 244 extend from the metal pillars 243 to the exterior conductive traces 262.

Figure 33:
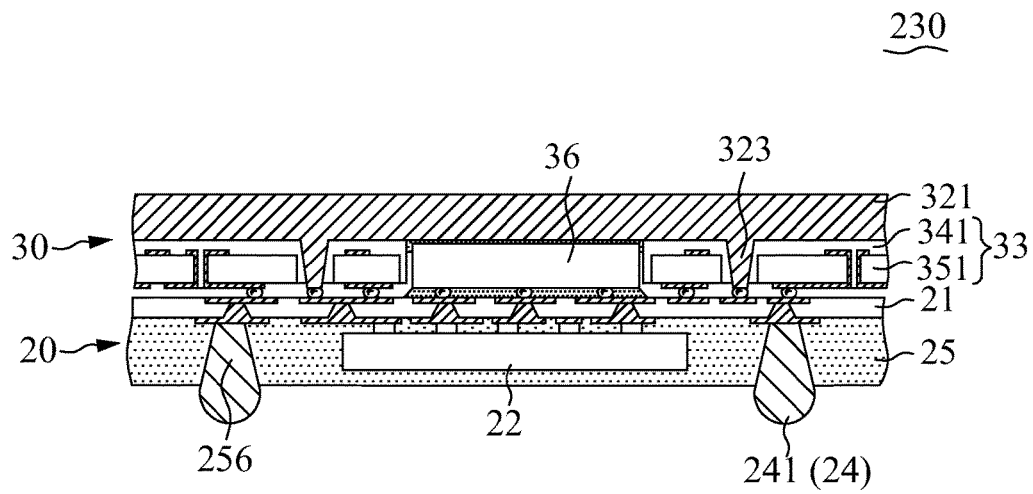
FIG. 33 is a cross-sectional view of yet another aspect of the semiconductor assembly in accordance with the second embodiment of the present invention.

FIG. 33 is a cross-sectional view of yet another aspect of the semiconductor assembly according to the second embodiment of the present invention. The semiconductor assembly 230 has solder balls 241 as the terminals 24. The semiconductor assembly 230 is similar to that illustrated in FIG. 31, except that the encapsulated device 20 includes no external routing circuitry 26 on the encapsulant 25 and the terminals 24 are formed in different configuration. In this aspect, the encapsulated device 20 is accomplished by deposition of the solder balls 241 into the via openings 256 in the encapsulant 25 of FIG. 24 and then removal of the sacrificial carrier 10. As a result, the solder balls 241 contact the first routing circuitry 21 and fill up the via openings 256 of the encapsulant 25 to serve as terminals 24.

Embodiment 3

FIGS. 34-55 are schematic views showing a method of making a semiconductor assembly with the heat spreader laterally extending beyond peripheral edges of the encapsulated device in accordance with the third embodiment of the present invention.

For purposes of brevity, any description in Embodiments above is incorporated herein insofar as the same is applicable, and the same description need not be repeated.

Figure 34:
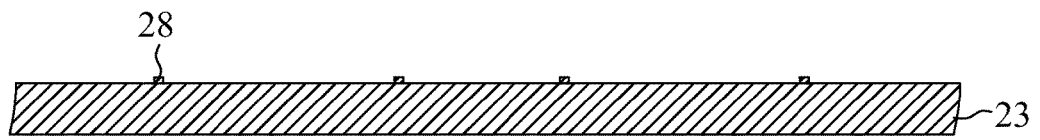
FIGS. 34 and 35 are cross-sectional and top perspective views, respectively, of alignment guides formed on a heat spreader in accordance with the third embodiment of the present invention.
Figure 35:
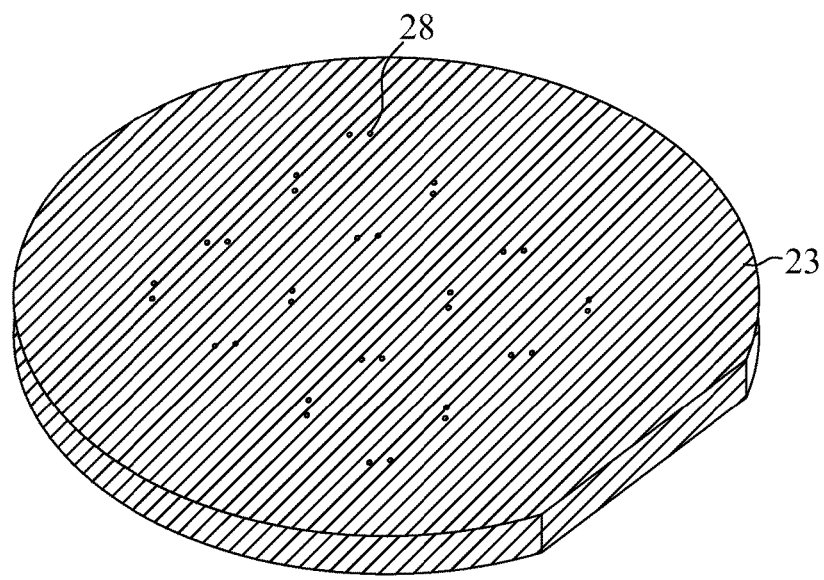

FIGS. 34 and 35 are cross-sectional and top perspective views, respectively, of the structure with multiple sets of alignment guides 28 on a heat spreader 23. The thickness of the heat spreader 23 preferably ranges from 0.1 to 1.0 mm. The alignment guides 28 project from a surface of the heat spreader 23 and can have a thickness of 5 to 200 microns. In this embodiment, the heat spreader 23 has a thickness of 0.5 mm, whereas the alignment guides 28 have a thickness of 50 microns. The alignment guides 28 can be pattern deposited by numerous techniques, such as electroplating, electroless plating, evaporating, sputtering or their combinations using photolithographic process, or be thin-film deposited followed by a metal patterning process. The metal patterning techniques include wet etching, electro-chemical etching, laser-assist etching, and their combinations with an etch mask (not shown) thereon that defines the alignment guides 28. For an electrically conductive heat spreader 23, the alignment guides 28 are deposited typically by plating of metal (such as copper). Alternatively, if an electrically non-conductive heat spreader 23 is used, a solder mask or photo resist may be used to form the alignment guides 28. As shown in FIG. 35, each set of the alignment guides 28 consists of plural posts and conforms to four corners of a subsequently disposed semiconductor chip. However, the alignment guide patterns are not limited thereto and can be in other various patterns against undesirable movement of the subsequently disposed semiconductor chip. For instance, the alignment guides 28 may consist of a continuous or discontinuous strip and conform to four sides, two diagonal corners or four corners of a subsequently disposed semiconductor device. Alternatively, the alignment guides 28 may laterally extend to the peripheral edges of the heat spreader 23 and have inner peripheral edges that conform to the peripheral edges of a subsequently disposed semiconductor chip.

Figure 36:
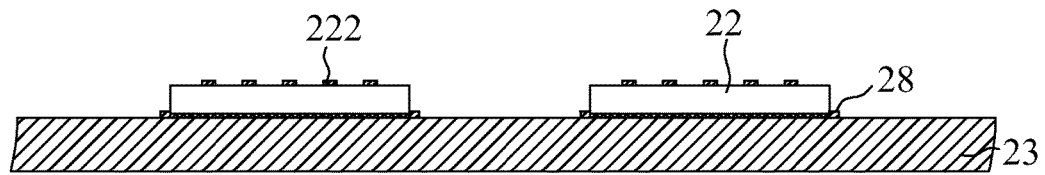
FIGS. 36 and 37 are cross-sectional and top perspective views, respectively, of the structure of FIGS. 34 and 35 further provided with first semiconductor chips in accordance with the third embodiment of the present invention.
Figure 37:
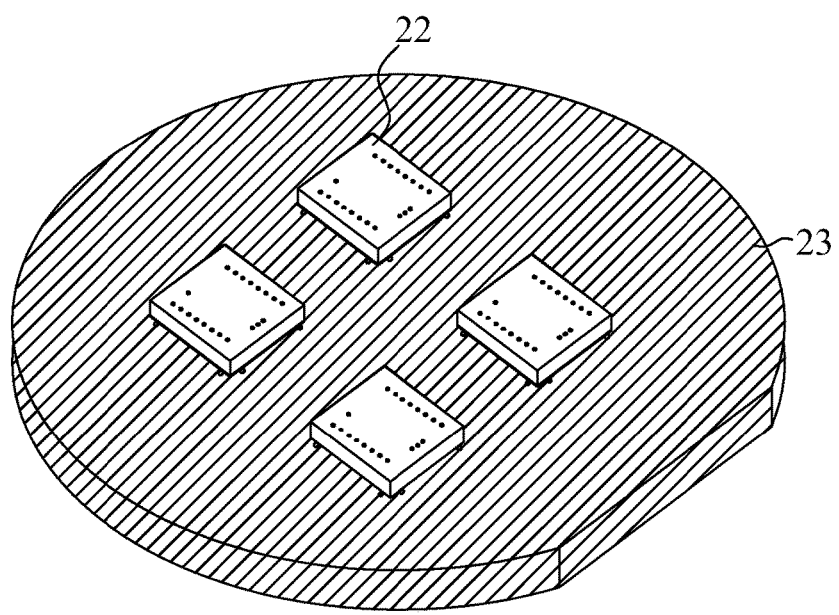

FIGS. 36 and 37 are cross-sectional and top perspective views, respectively, of the structure with first semiconductor chips 22 attached to the heat spreader 23 typically by a thermally conductive adhesive. In this illustration, the first semiconductor chips 22 each includes protruded bumps 222 at its active surface, and is attached to the heat spreader 23 with its inactive surface facing the heat spreader 23. Each set of the alignment guides 28 is laterally aligned with and in close proximity to the peripheral edges of each first semiconductor chip 22. The chip placement accuracy is provided by the alignment guides 28 that extend beyond the inactive surface of the first semiconductor chips 22 in the upward direction and are located beyond and laterally aligned with the four corners of the first semiconductor chips 22 in the lateral directions. Because the alignment guides 28 are in close proximity to and conform to the four corners of the first semiconductor chips 22 in lateral directions, any undesirable movement of the first semiconductor chips 22 due to adhesive curing can be avoided. Preferably, a gap in between the alignment guides 28 and the first semiconductor chips 22 is in a range of about 5 to 50 microns. Additionally, the first semiconductor chips 22 also may be attached without the alignment guides 28.

Figure 38:
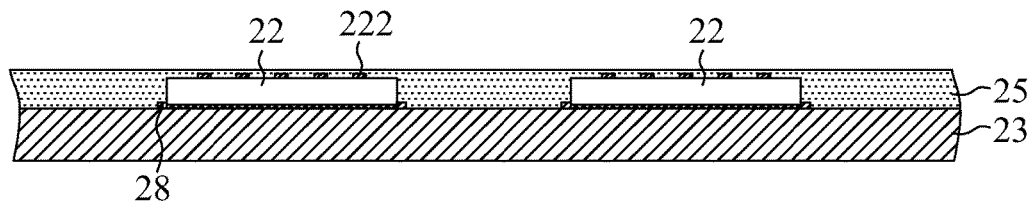
FIG. 38 is a cross-sectional view of the structure of FIG. 36 provided with an encapsulant in accordance with the third embodiment of the present invention.

FIG. 38 is a cross-sectional view of the structure provided with an encapsulant 25 on the first semiconductor chips 22, and the heat spreader 23. The encapsulant 25 covers the first semiconductor chips 22 and the heat spreader 23 from above and surrounds and conformally coats and covers sidewalls of the first semiconductor chips 22 and extends laterally from the first semiconductor chips 22 to the peripheral edges of the structure.

Figure 39:
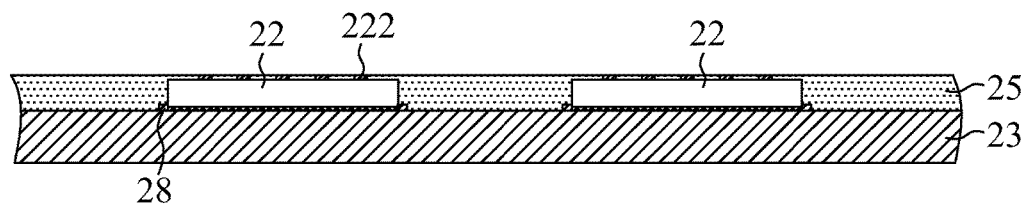
FIG. 39 is a cross-sectional view of the structure of FIG. 38 after removal of a top portion of the encapsulant in accordance with the third embodiment of the present invention.

FIG. 39 is a cross-sectional view of the structure with the protruded bumps 222 of the first semiconductor chips 22 exposed from above. The top portion of the encapsulant 25 can be removed by lapping, grinding or laser. After partial removal of the encapsulant 25, the encapsulant 25 has a top surface substantially coplanar with the exterior surface of the protruded bumps 222.

Figure 40:
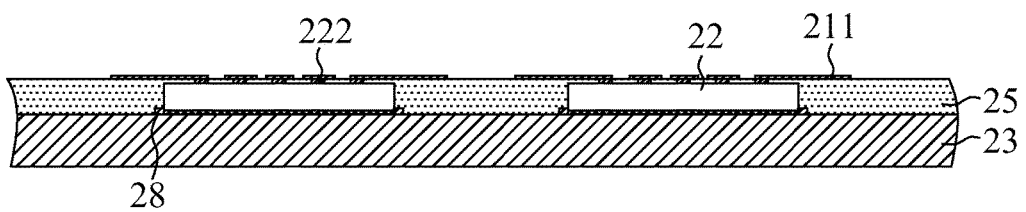
FIGS. 40 and 41 are cross-sectional and top perspective views, respectively, of the structure of FIG. 39 further provided with primary conductive traces in accordance with the third embodiment of the present invention.
Figure 41:
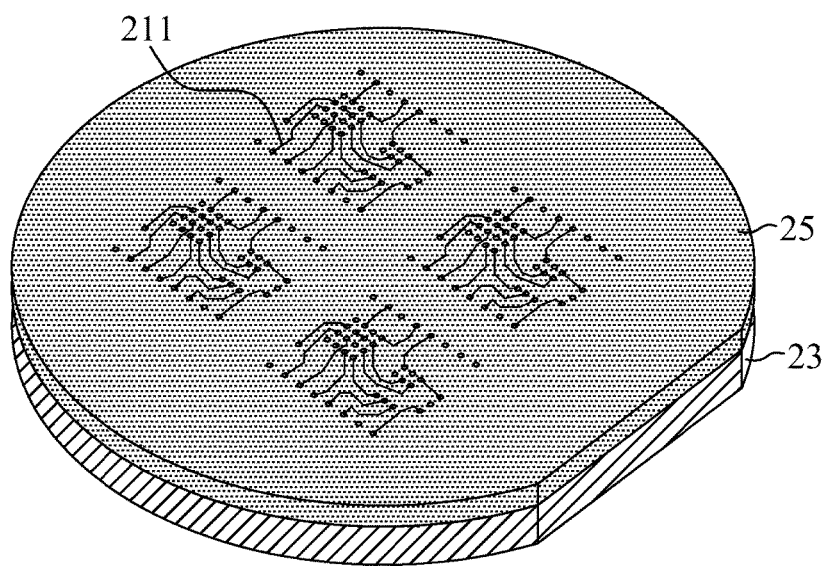

FIGS. 40 and 41 are cross-sectional and top perspective views, respectively, of the structure provided with primary conductive traces 211 by metal deposition and metal patterning process. The primary conductive traces 211 extend laterally on the encapsulant 25 and are electrically coupled to the protruded bumps 222 of the first semiconductor chips 22.

Figure 42:
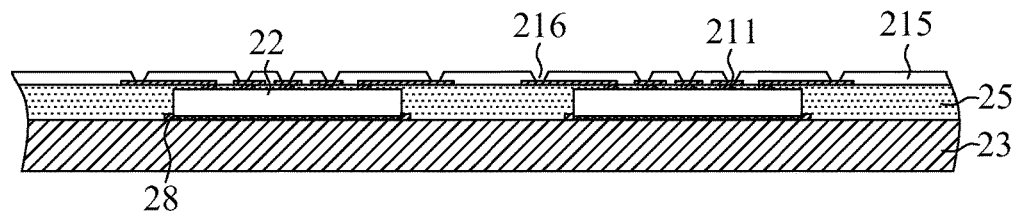
FIG. 42 is a cross-sectional view of the structure of FIG. 40 further provided with a dielectric layer and via openings in accordance with the third embodiment of the present invention.

FIG. 42 is a cross-sectional view of the structure with a dielectric layer 215 on the encapsulant 25 as well as the primary conductive traces 211 and via openings 216 in the dielectric layer 215. The dielectric layer 215 contacts and covers and extends laterally on the encapsulant 25 and the primary conductive traces 211 from above. After the deposition of the dielectric layer 215, the via openings 216 are formed and extend through the dielectric layer 215 and are aligned with selected portions of the primary conductive traces 211.

Figure 43:
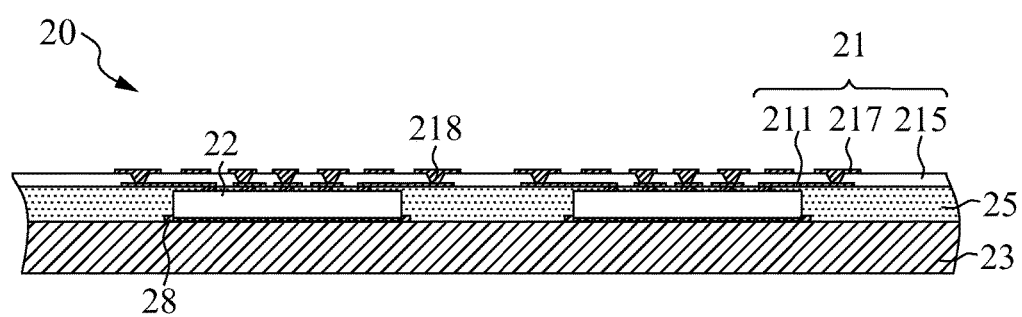
FIGS. 43 and 44 are cross-sectional and top perspective views, respectively, of the structure of FIG. 42 further provided with first conductive traces in accordance with the third embodiment of the present invention.
Figure 44:
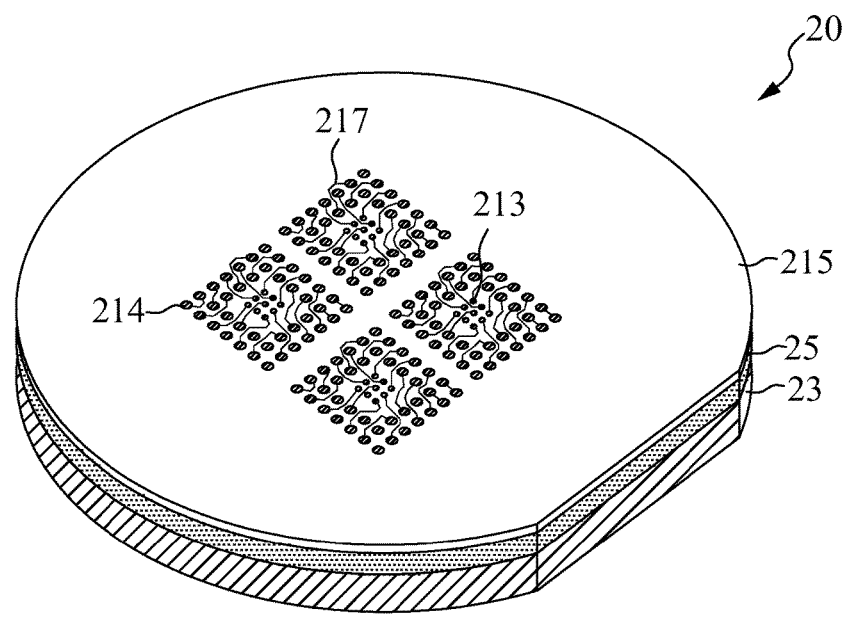

FIGS. 43 and 44 are cross-sectional and top perspective views, respectively, of the structure provided with first conductive traces 217 on the dielectric layer 215 by metal deposition and metal patterning process. The first conductive traces 217 extend from the primary conductive traces 211 in the upward direction, fill up the via openings 216 to form metallized vias 218 in direct contact with the primary conductive traces 211, and extend laterally on the dielectric layer 215. As shown in FIG. 44, the first conductive traces 217 include first contact pads 213 and second contact pads 214. The second contact pads 214 have larger pad size and pitch than those of the first contact pads 213. As a result, the first contact pads 213 can provide electrical contacts for another semiconductor chip, whereas the second contact pads 214 can provide electrical contacts for a next level interconnect structure.

At this stage, an encapsulated device 20 is accomplished and includes a heat spreader 23, alignment guides 28, first semiconductor chips 22, an encapsulant 25, and a first routing circuitry 21. In this illustration, the first routing circuitry 21 includes primary conductive traces 211, a dielectric layer 215 and first conductive traces 217.

Figure 45:
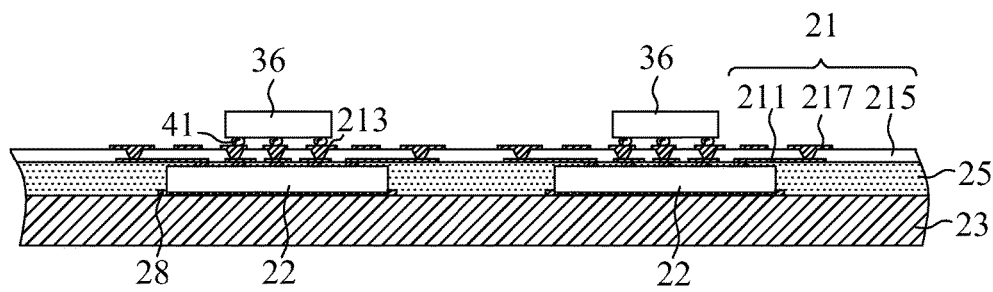
FIGS. 45 and 46 are cross-sectional and top perspective views, respectively, of the structure of FIGS. 43 and 44 further provided with second semiconductor chips in accordance with the third embodiment of the present invention.
Figure 46:
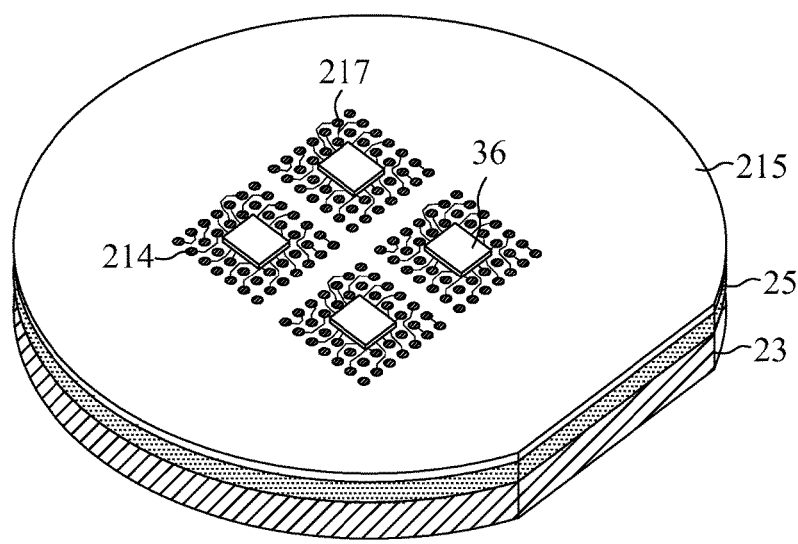

FIGS. 45 and 46 are cross-sectional and top perspective views, respectively, of the structure provided with second semiconductor chips 36 electrically coupled to the first routing circuitry 21. The second semiconductor chips 36 have an active surface facing the first routing circuitry 21, and can be electrically coupled to the first contact pads 213 of the conductive traces 217 using first bumps 41.

FIGS. 47-51 are cross-sectional views showing an alternative process of forming the structure having the second semiconductor chip 36 electrically coupled to a diced unit of encapsulated device 20.

Figure 47:
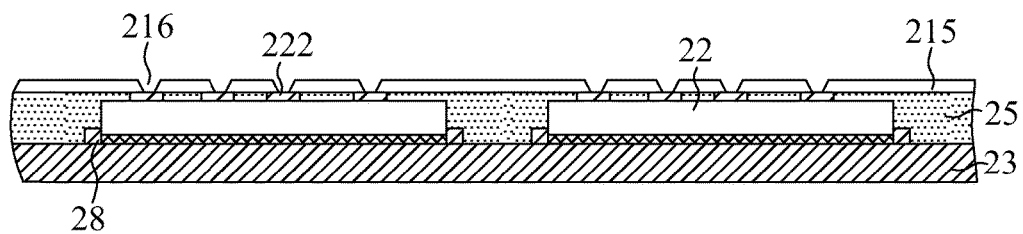
FIG. 47 is a cross-sectional view of the structure of FIG. 39 further provided with a dielectric layer and via openings in accordance with the third embodiment of the present invention.

FIG. 47 is a cross-sectional view of the structure with a dielectric layer 215 laminated/coated on the first semiconductor chips 22 and the encapsulant 25 and via openings 216 in the dielectric layer 215. The dielectric layer 215 contacts and covers and extends laterally on the protruded bumps 222 of the first semiconductor chips 22 and the encapsulant 25 from above. The via openings 216 extend through the dielectric layer 215 and are aligned with the protruded bumps 222 of the first semiconductor chips 22.

Figure 48:
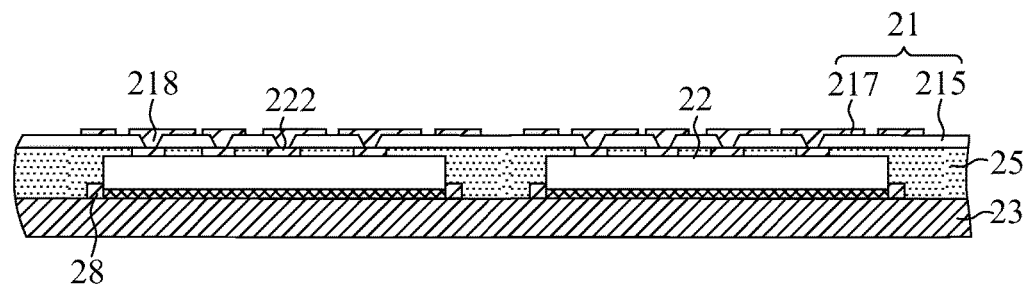
FIG. 48 is a cross-sectional view of the structure of FIG. 47 further provided with first conductive traces in accordance with the third embodiment of the present invention.

FIG. 48 is a cross-sectional view of the structure provided with first conductive traces 217 on the dielectric layer 215 by metal deposition and metal patterning process. The first conductive traces 217 extend from the protruded bumps 222 of the first semiconductor chips 22 in the upward direction, fill up the via openings 216 to form metallized vias 218 in direct contact with the protruded bumps 222, and extend laterally on the dielectric layer 215.

Figure 49:
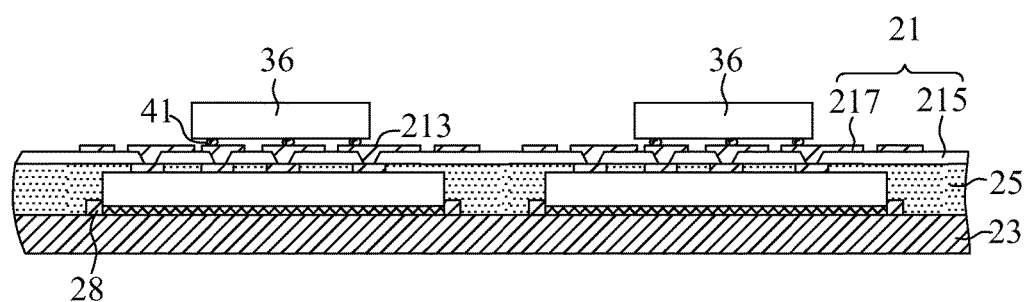
FIG. 49 is a cross-sectional view of the structure of FIG. 48 further provided with second semiconductor chips in accordance with the third embodiment of the present invention.

FIG. 49 is a cross-sectional view of structure provided with second semiconductor chips 36 on the first conductive traces 217. The second semiconductor chips 36 are electrically coupled to the first contact pads 213 of the first conductive traces 217 using the first bumps 41.

Figure 50:
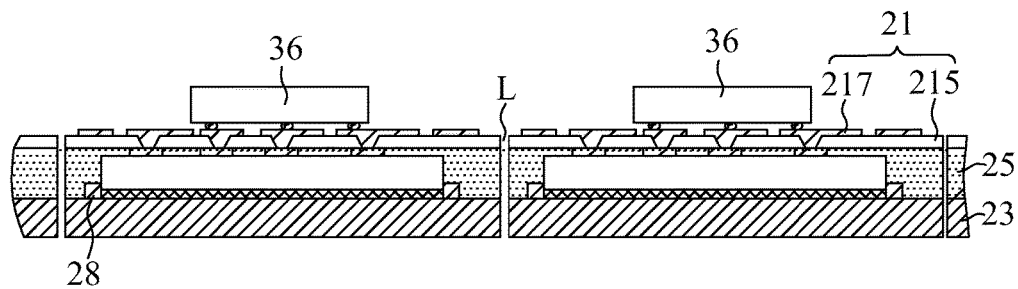
FIG. 50 is a cross-sectional view of a diced state of the panel-scale structure of FIG. 49 in accordance with the third embodiment of the present invention.

FIG. 50 is a cross-sectional view of the panel-scale structure of FIG. 49 diced into individual pieces. In this illustration, the panel-scale structure is singulated into individual pieces along dicing lines "L".

Figure 51:
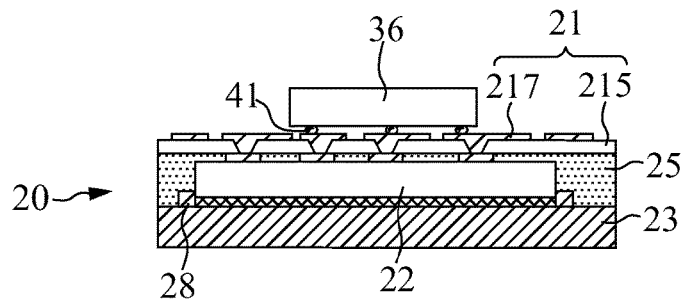
FIG. 51 is a cross-sectional view of the structure corresponding to a diced unit in FIG. 50 in accordance with the third embodiment of the present invention.

FIG. 51 is a cross-sectional view of an individual piece having a second semiconductor chip 36 electrically coupled to an encapsulated device 20 that includes a heat spreader 23, an alignment guide 28, a first semiconductor chip 22, an encapsulant 25, and a first routing circuitry 21. In this illustration, the first routing circuitry 21 includes a dielectric 215 and first conductive traces 217 laterally extending beyond peripheral edges of the first semiconductor chip 22 and the second semiconductor chip 36. The first semiconductor chip 22 is electrically coupled to the first routing circuitry 21 from below and enclosed by the heat spreader 23 and the encapsulant 25, whereas the second semiconductor chip 36 is electrically coupled to the first routing circuitry 21 from above and is face-to-face electrically connected to the first semiconductor chip 22 through the first routing circuitry 21.

Figure 52:
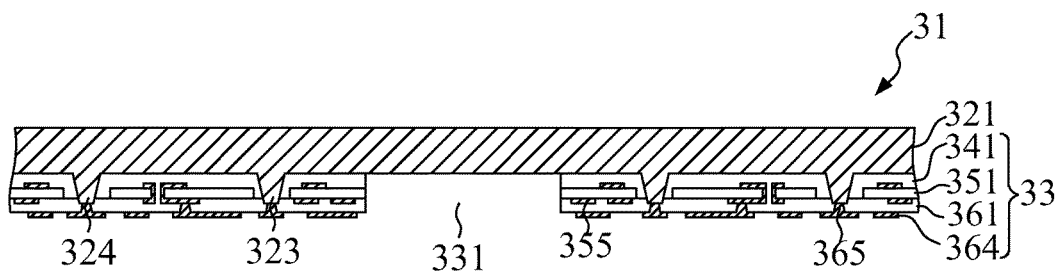
FIGS. 52 and 53 are cross-sectional and bottom perspective views, respectively, of a heat spreader in accordance with the third embodiment of the present invention.
Figure 53:
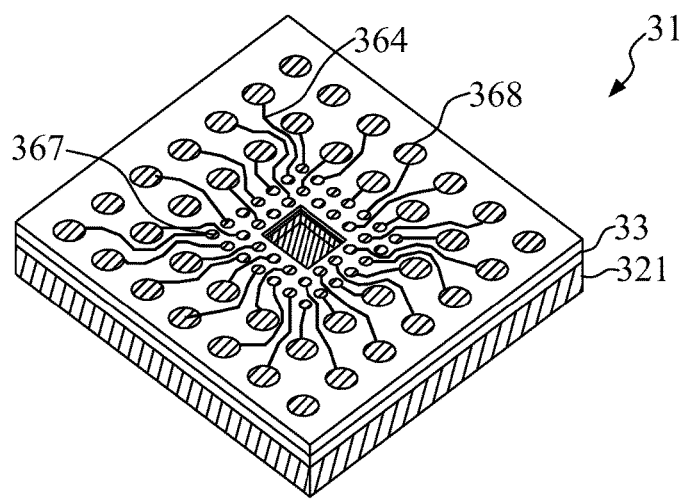

FIGS. 52 and 53 are cross-sectional and bottom perspective views, respectively, of a heat spreader 31. The heat spreader 31 is similar to that illustrated in FIG. 14, except that (i) the heat spreader 31 further has additional posts 324, and (ii) the second routing circuitry 33 further includes a buildup insulating layer 361 laminated/coated on the routing substrate 351 and the posts 323, 324, and fourth conductive traces 364 deposited on the buildup insulating layer 361. The buildup insulating layer 361 contacts and covers and extends laterally on the routing substrate 351 and the posts 323, 324 from below. The buildup insulating layer 361 typically has a thickness of 50 microns, and can be made of epoxy resin, glass-epoxy, polyimide, or the like. The fourth conductive traces 364 is deposited on the buildup insulating layer 361 by metal deposition and metal patterning process, and includes metallized vias 365 that contact the third conductive traces 355 of the routing substrate 351 and the posts 323, 324 and extend through the buildup insulating layer 361. As shown in FIG. 53, the fourth conductive traces 364 includes first terminal pads 367 and second terminal pads 368. The pad size and the pad pitch of the first terminal pads 367 are larger than those of the first semiconductor chip 22 and the second semiconductor chip 36 and match the second contact pads 214 of the first routing circuitry 21. The pad size and the pad pitch of the second terminal pads 368 are larger than those of the first terminal pads 367 and match a next level interconnect structure.

Figure 54:
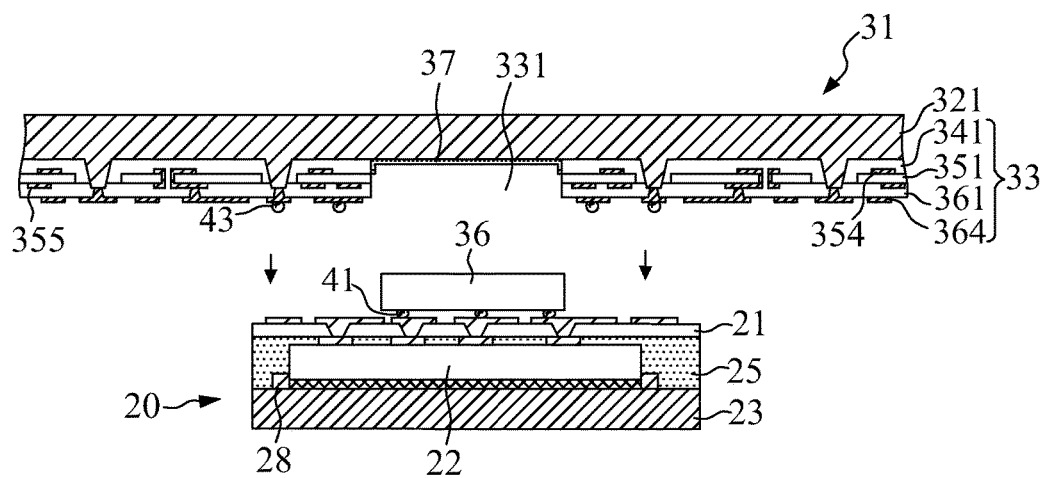
FIG. 54 is a cross-sectional view showing the step of stacking the heat spreader of FIG. 52 on the structure of FIG. 51 in accordance with the third embodiment of the present invention.

FIG. 54 is a cross-sectional view showing the step of stacking the heat spreader 31 of FIG. 52 on the structure of FIG. 51. Before the stacking process, a thermally conductive contact element 37 is dispensed on the shielding lid 321 exposed from the through opening 331 of the second routing circuitry 33 and second bumps 43 are mounted on the fourth conductive traces 364 of the second routing circuitry 33.

Figure 55:
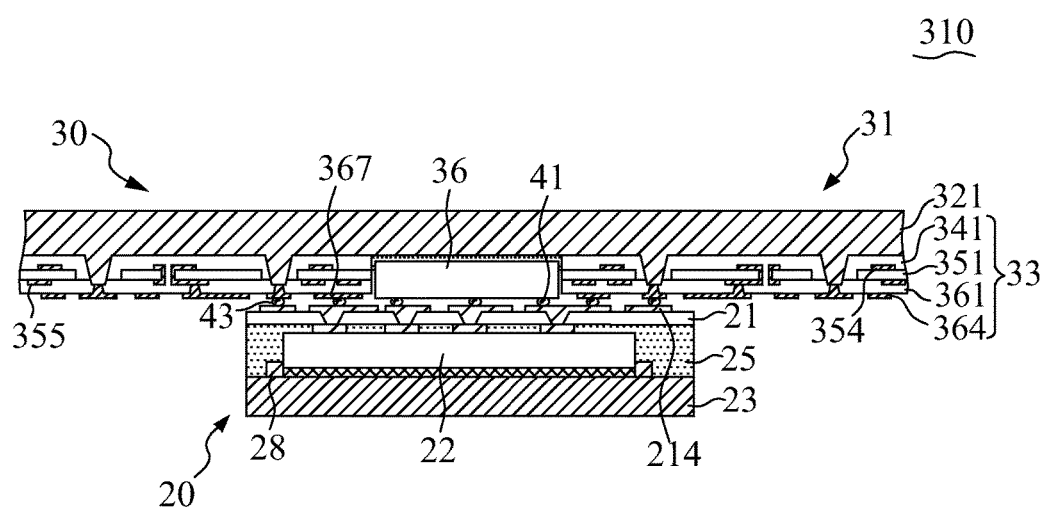
FIG. 55 is a cross-sectional view of the heat spreader of FIG. 52 electrically coupled to the structure of FIG. 51 to finish the fabrication of a semiconductor assembly in accordance with the third embodiment of the present invention.

FIG. 55 is a cross-sectional view of the structure with the heat spreader 31 attached to the second semiconductor chip 36 and electrically coupled to the first routing circuitry 21. The second semiconductor chip 36 is inserted into the through opening 331 of the second routing circuitry 33 and thermally conductible to the shielding lid 321 of the heat spreader 31 by the thermally conductive contact element 37. The first terminal pads 367 of the second routing circuitry 33 are electrically coupled to the second contact pads 214 of the first routing circuitry 21 by the second bumps 43.

Accordingly, as shown in FIG. 55, a semiconductor assembly 310 is accomplished and includes an encapsulated device 20 and a thermally enhanced device 30. In this illustration, the encapsulated device 20 includes a first routing circuitry 21, a first semiconductor chip 22, a heat spreader 23, an encapsulant 25 and an alignment guide 28, whereas the thermally enhanced device 30 includes a heat spreader 31 and a second semiconductor chip 36.

The first semiconductor chip 22 is attached to the heat spreader 23 with the alignment guide 28 around its inactive surface and conforming to its four corners. The first routing circuitry 21 is electrically coupled to the first semiconductor chip 22 and laterally extends beyond peripheral edge of the first semiconductor chip 22 and over the encapsulant 25 that laterally surrounds the first semiconductor chip 22. The second semiconductor chip 36 is face-to-face electrically connected to the first semiconductor chip 22 through the first routing circuitry 21 and first bumps 41 in contact with the first routing circuitry 21. As such, the first routing circuitry 21 offers the shortest interconnection distance between the first semiconductor chip 22 and the second semiconductor chip 36, and provides first level fan-out routing for the first semiconductor chip 22 and the second semiconductor chip 36. The heat spreader 31 has a shielding lid 321, an array of posts 323, 324, and a second routing circuitry 33. The shielding lid 321 of the heat spreader 31 is thermally conductible to and covers the second semiconductor chip 36 from above, whereas the posts 323, 324 of the heat spreader 31 laterally surround the second semiconductor chip 36 and electrically connected to the second routing circuitry 33 for ground connection. The second routing circuitry 33 of the heat spreader 31 includes second conductive traces 354, third conductive traces 355 and fourth conductive traces 364 laterally extending beyond peripheral edges of the first routing circuitry 21, and is electrically coupled to the first routing circuitry 21 using second bumps 43. Accordingly, the second routing circuitry 33 can provide second level fan-out routing for the first routing circuitry 21 and electrical contacts for external connection, and the shielding lid 321 of the heat spreader 31 is electrically connected to the first routing circuitry 21 and provides thermal dissipation and EMI shielding for the second semiconductor chip 36.

Embodiment 4

FIGS. 56-71 are schematic views showing a method of making a semiconductor assembly with terminals around peripheral edges of the encapsulated device in accordance with the fourth embodiment of the present invention.

For purposes of brevity, any description in Embodiments above is incorporated herein insofar as the same is applicable, and the same description need not be repeated.

Figure 56:
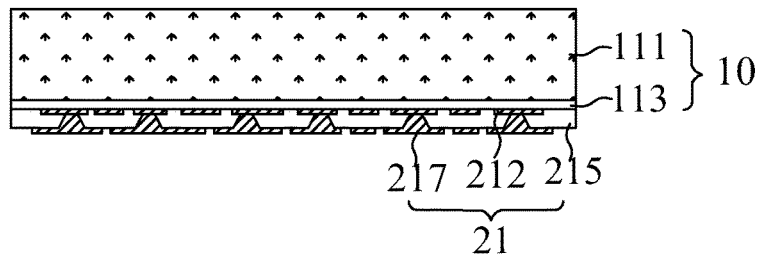
FIG. 56 is a cross-sectional view of the structure with a first routing circuitry formed on a sacrificial carrier in accordance with the fourth embodiment of the present invention.

FIG. 56 is a cross-sectional view of the structure with a first routing circuitry 21 detachably adhered over a sacrificial carrier 10. In this illustration, the sacrificial carrier 10 is a double-layer structure and includes a support sheet 111 and a barrier layer 113 deposited on the support sheet 111. The first routing circuitry 21 is formed on the barrier layer 113 by the steps illustrated in FIGS. 1-3. The barrier layer 113 can have a thickness of 0.001 to 0.1 mm and may be a metal layer that is inactive against chemical etching during chemical removal of the support sheet 111 and can be removed without affecting the routing traces 212. For instance, the barrier layer 113 may be made of tin or nickel when the support sheet 111 and the routing traces 212 are made of copper. Further, in addition to metal materials, the barrier layer 113 can also be a dielectric layer such as a peelable laminate film. In this embodiment, the support sheet 111 is a copper sheet, and the barrier layer 113 is a nickel layer of 5 microns in thickness.

Figure 57:
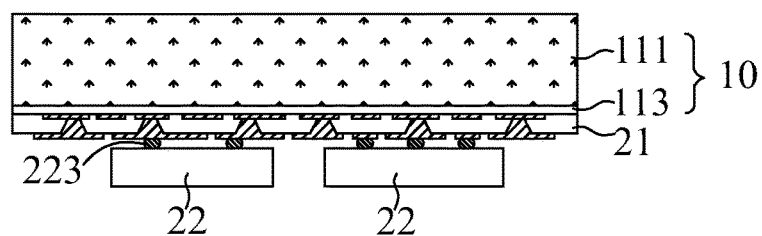
FIG. 57 is a cross-sectional view of the structure of FIG. 56 further provided with first semiconductor chips in accordance with the fourth embodiment of the present invention.

FIG. 57 is a cross-sectional view of the structure with first semiconductor chips 22 electrically coupled to the first routing circuitry 21 from below. The first semiconductor chips 22 are electrically coupled to the first routing circuitry 21 using conductive bumps 223.

Figure 58:
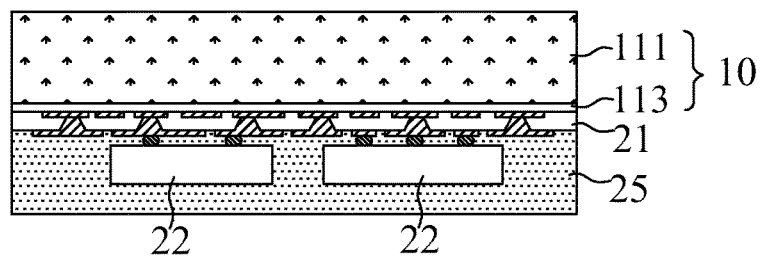
FIG. 58 is a cross-sectional view of the structure of FIG. 57 further provided with an encapsulant in accordance with the fourth embodiment of the present invention.

FIG. 58 is a cross-sectional view of the structure with an encapsulant 25 on the first routing circuitry 21 and the first semiconductor chips 22. The encapsulant 25 covers the first routing circuitry 21 and the first semiconductor chips 22 from below and surrounds and conformally coats and covers sidewalls of the first semiconductor chips 22.

Figure 59:
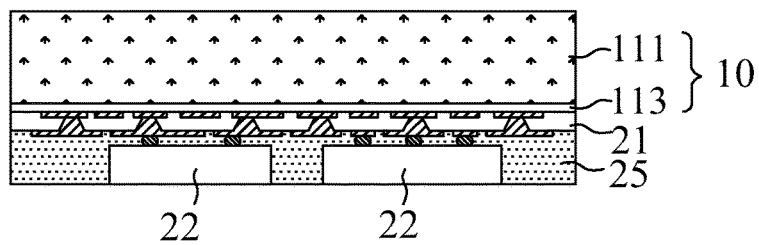
FIG. 59 is a cross-sectional view of the structure of FIG. 58 after removal of a bottom portion of the encapsulant in accordance with the fourth embodiment of the present invention.

FIG. 59 is a cross-sectional view of the structure after removal of the lower portion of the encapsulant 25. The inactive surface of the first semiconductor chips 22 is exposed from below and substantially coplanar with the bottom surface of the encapsulant 25.

Figure 60:
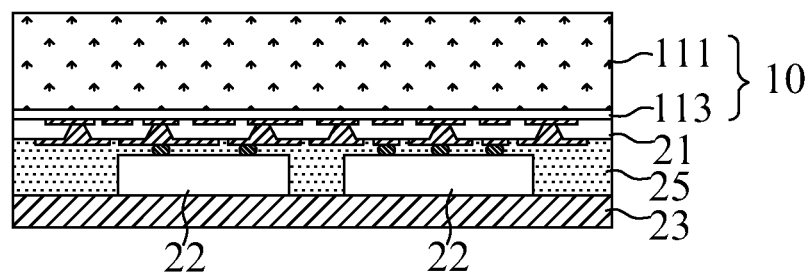
FIG. 60 is a cross-sectional view of the structure of FIG. 59 further provided with a heat spreader in accordance with the fourth embodiment of the present invention.

FIG. 60 is a cross-sectional view of the structure with a heat spreader 23 attached to the first semiconductor chips 22.

The heat spreader 23 is attached on the inactive surface of the first semiconductor chips 22 and the bottom surface of the encapsulant 25.

Figure 61:
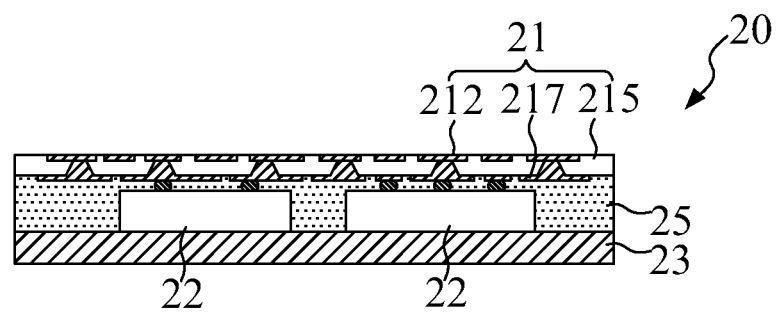
FIGS. 61 and 62 are cross-sectional and top perspective views, respectively, of the structure of FIG. 60 after removal of the sacrificial carrier in accordance with the fourth embodiment of the present invention.
Figure 62:
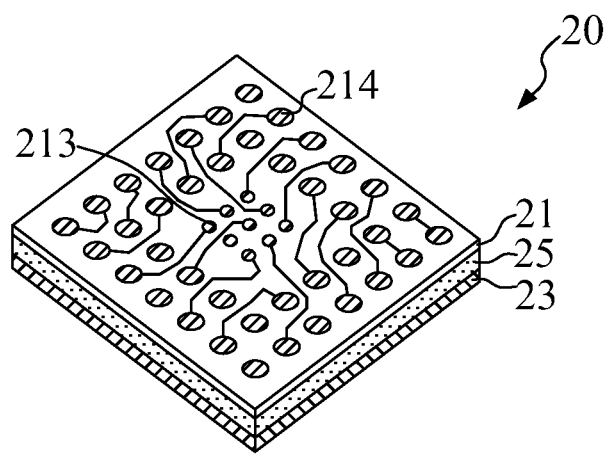

FIGS. 61 and 62 are cross-sectional and top perspective views, respectively, of the structure after removal of the sacrificial carrier 10. The first routing circuitry 21 is exposed from above by removing the support sheet 111 made of copper using an alkaline etching solution and then removing the barrier layer 113 made of nickel using an acidic etching solution. In another aspect, if the barrier layer 113 is a peelable laminate film, the barrier layer 113 can be removed by mechanical peeling or plasma ashing. As shown in FIG. 62, the routing traces 212 include first contact pads 213 and second contact pads 214. The second contact pads 214 have larger pad size and pitch than those of the first contact pads 213. As a result, the first contact pads 213 can provide electrical contacts for another semiconductor chip, whereas the second contact pads 214 can provide electrical contacts for a next level interconnect structure.

At this stage, an encapsulated device 20 is accomplished and includes a first routing circuitry 21, first semiconductor chips 22 and an encapsulant 25.

Figure 63:
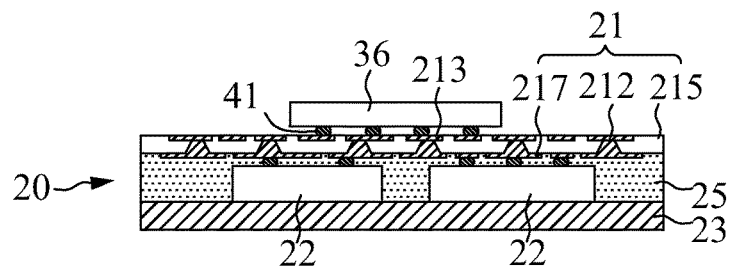
FIGS. 63 and 64 are cross-sectional and top perspective views, respectively, of the structure of FIGS. 61 and 62 further provided with a second semiconductor chip in accordance with the fourth embodiment of the present invention.
Figure 64:
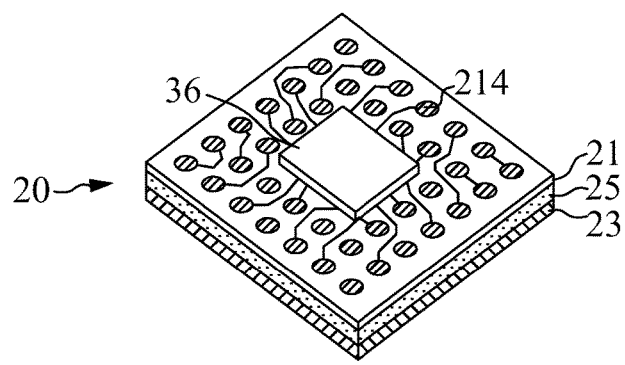

FIGS. 63 and 64 are cross-sectional and top perspective views, respectively, of the structure with a second semiconductor chip 36 electrically coupled to the first routing circuitry 21. The second semiconductor chip 36 is flip-chip mounted to the first routing circuitry 21 by an array of first bumps 41 in contact with the first contact pads 213 of the first routing circuitry 21.

Figure 65:
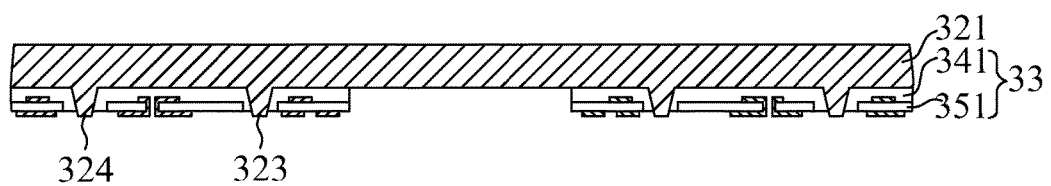
FIG. 65 is a cross-sectional view of the structure having a shielding lid, posts, a binding film and a routing circuitry in accordance with the fourth embodiment of the present invention.

FIG. 65 is a cross-sectional view of the structure having a shielding lid 321, an array of posts 323, 324 and a second routing circuitry 33. In this illustration, the structure of FIG. 65 is similar to that illustrated in FIG. 52, except that the posts 323, 324 extend through the second routing circuitry 33 without a buildup insulating layer and fourth conductive traces on the routing substrate 351 and the posts 323, 324.

Figure 66:
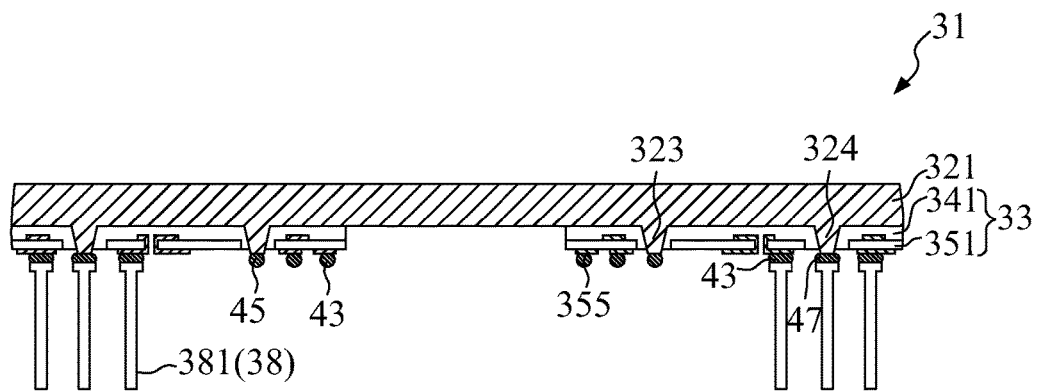
FIG. 66 is a cross-sectional view of the structure of FIG. 65 further provided with second bumps, third bumps, fourth bumps and metal pins to finish the fabrication of a heat spreader in accordance with the fourth embodiment of the present invention.

FIG. 66 is a cross-sectional view of the structure provided with second bumps 43, third bumps 45, fourth bumps 47 and metal pins 381. The second bumps 43 are mounted on the third conductive traces 355 of the second routing circuitry 33, whereas the third bumps 45 and the fourth bumps 47 are mounted on the posts 323, 324, respectively. Some of the metal pins 381 are electrically coupled to the second bumps 43 disposed at the peripheral area of the exterior surface of the second routing circuitry 33, and the others are attached to the fourth bumps 47 on the posts 324.

At this stage, a heat spreader 31 is accomplished and includes a shielding lid 321, an array of posts 323, 324, a second routing circuitry 33 and an array of terminals 38. The terminals 38 are illustrated as the metal pins 381 in this aspect and electrically coupled to the second routing circuitry 33 for signal routing and further electrically coupled to the shielding lid 321 for ground connection.

Figure 67:
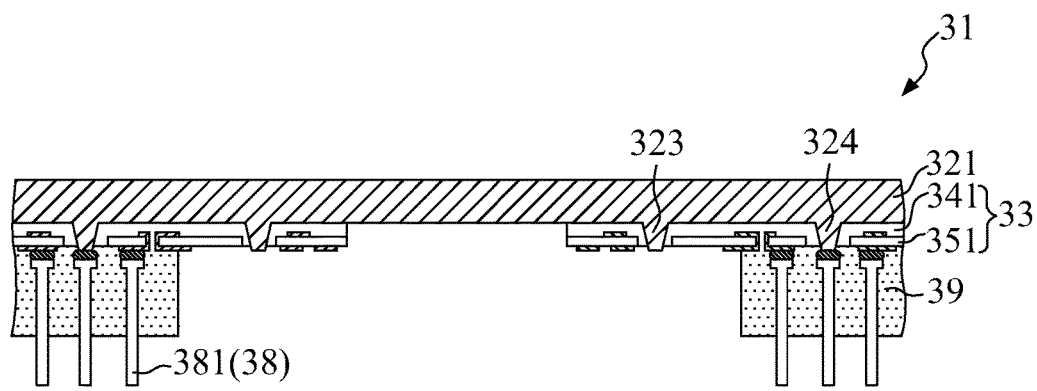
FIG. 67 is a cross-sectional view of another aspect of the heat spreader in accordance with the fourth embodiment of the present invention.

FIG. 67 is a cross-sectional view of another aspect of the heat spreader according to the fourth embodiment of the present invention. The heat spreader 31 has a stiffener 39 on the exterior surface of the second routing circuitry 33. The stiffener 39 is formed typically by printing or molding of resin sealant to cover the terminals 38 and the peripheral area of the exterior surface of the second routing circuitry 33 from below, and surrounds and conformally coats and covers the terminals 38 in the lateral directions. After deposition of the stiffener 39, a lower portion of the stiffener 39 is removed to expose the terminals 38 from below.

Figure 68:
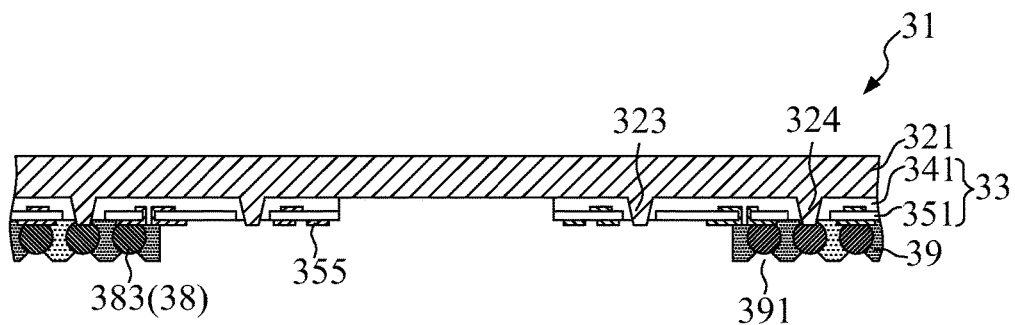
FIG. 68 is a cross-sectional view of yet another aspect of the heat spreader in accordance with the fourth embodiment of the present invention.

FIG. 68 is a cross-sectional view of yet another aspect of the heat spreader according to the fourth embodiment of the present invention. The heat spreader 31 has solder balls 383 in the stiffener 39. In this aspect, the heat spreader 31 is similar to that illustrated in FIG. 67, except that (i) the solder balls 383 are provided in contact with the third conductive traces 355 of the second routing circuitry 33 and the posts 324 and serve as the terminals 38, and (ii) the stiffener 39 has openings 391 to expose selected portions of the solder balls 383 from below.

Figure 69:
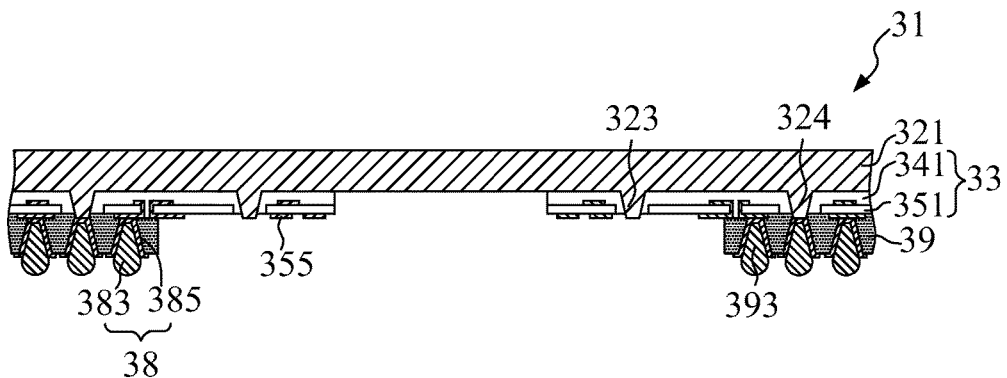
FIG. 69 is a cross-sectional view of yet another aspect of the heat spreader in accordance with the fourth embodiment of the present invention.

FIG. 69 is a cross-sectional view of yet another aspect of the heat spreader according to the fourth embodiment of the present invention. The heat spreader 31 has conductive vias 385 in the stiffener 39 and solder balls 383 in contact with the conductive vias 385. In this aspect, the heat spreader 31 is similar to that illustrated in FIG. 67, except that the terminals 38 include a combination of the solder balls 383 and the conductive vias 385. The conductive vias 385 are formed by metal deposition in via openings 393 of the stiffener 39 and contact the third conductive traces 355 of the second routing circuitry 33 and the posts 324. After deposition of the conductive vias 385, the solder balls 383 are provided in contact with the conductive vias 385 and fill up the remaining space of the via openings 393 in the stiffener 39 and extend beyond the exterior surface of the stiffener 39 in the downward direction.

Figure 70:
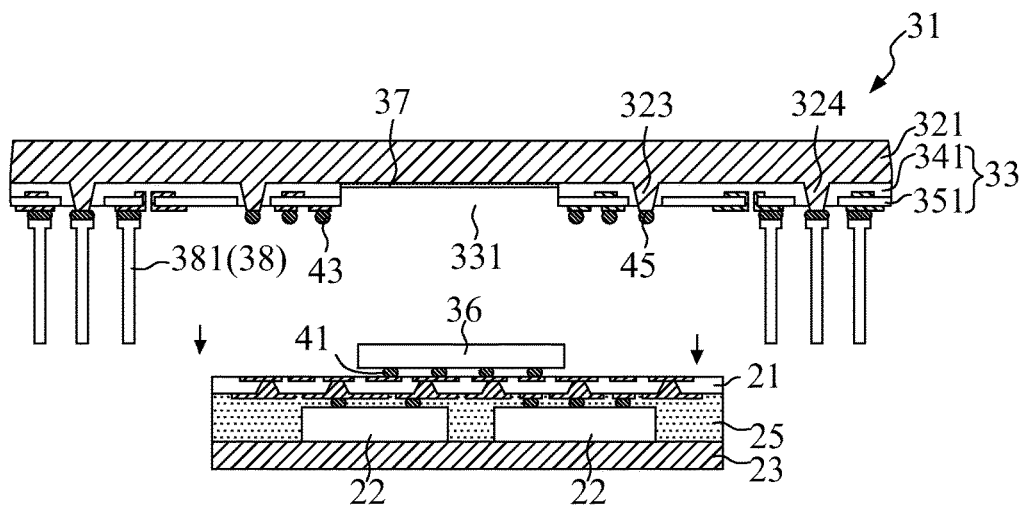
FIG. 70 is a cross-sectional view showing the step of stacking the heat spreader of FIG. 66 on the structure of FIG. 63 in accordance with the fourth embodiment of the present invention.

FIG. 70 is a cross-sectional view showing the step of stacking the heat spreader 31 of FIG. 66 on the structure of FIG. 63. Before the stacking process, a thermally conductive contact element 37 is dispensed on the shielding lid 321 exposed from the through opening 331 of the second routing circuitry 33.

Figure 71:
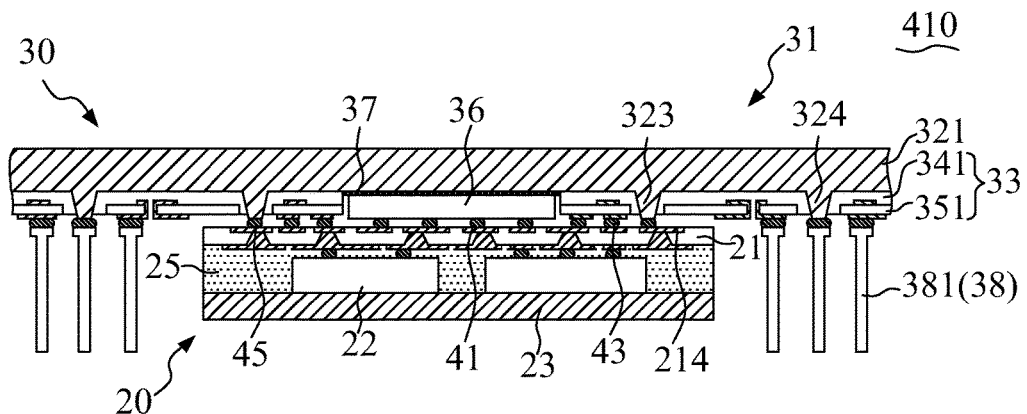
FIG. 71 is a cross-sectional view of the heat spreader of FIG. 66 electrically coupled to the structure of FIG. 63 to finish the fabrication of a semiconductor assembly in accordance with the fourth embodiment of the present invention.

FIG. 71 is a cross-sectional view of the structure with the heat spreader 31 attached to the second semiconductor chip 36 and electrically coupled to the first routing circuitry 21. The second semiconductor chip 36 is disposed within the through opening 331 of the second routing circuitry 33 and thermally conductible to the shielding lid 321 of the heat spreader 31 by the thermally conductive contact element 37. The second routing circuitry 33 and the posts 323 of the heat spreader 31 are electrically coupled to the second contact pads 214 of the first routing circuitry 21 by the second bumps 43 and the third bumps 45, respectively.

Accordingly, as shown in FIG. 71, a semiconductor assembly 410 is accomplished and includes an encapsulated device 20 and a thermally enhanced device 30. In this illustration, the encapsulated device 20 includes a first routing circuitry 21, first semiconductor chips 22, a heat spreader 23 and an encapsulant 25, whereas the thermally enhanced device 30 includes a shielding lid 321, an array of posts 323, 324, a second routing circuitry 33, a second semiconductor chip 36 and an array of terminals 38.

The first semiconductor chips 22 and the second semiconductor chip 36 are disposed at two opposite sides of the first routing circuitry 21 and face-to-face electrically connected to each other through the first routing circuitry 21 therebetween. The first semiconductor chips 22 are embedded in the encapsulant 25, whereas the second semiconductor chip 36 is accommodated in the through opening 331 of the second routing circuitry 33 and thermally conductible to the shielding lid 321. The first routing circuitry 21 and the second routing circuitry 33 are electrically coupled to each other and provide staged fan-out routing for the first semiconductor chips 22 and the second semiconductor chip 36. The second routing circuitry 33 laterally extends beyond the peripheral edges of the first routing circuitry 21 to provide electrical contacts for next-level interconnection. The terminals 38 surround the encapsulated device 20, and are electrically coupled to the shielding lid 321 through the posts 324 for ground connection and also electrically coupled to the second routing circuitry 33 for signal routing.

Figure 72:
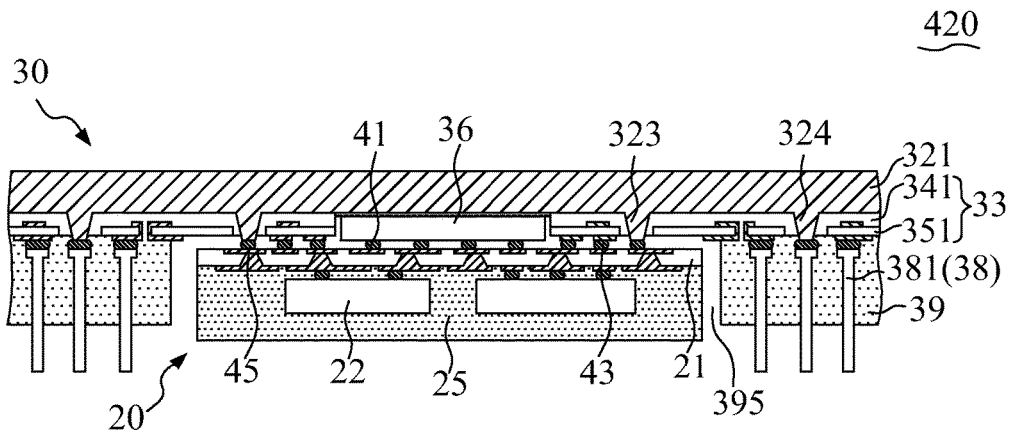
FIG. 72 is a cross-sectional view of another aspect of the semiconductor assembly in accordance with the fourth embodiment of the present invention.

FIG. 72 is a cross-sectional view of another aspect of the semiconductor assembly according to the fourth embodiment of the present invention. The semiconductor assembly 420 has an encapsulated device 20 accommodated in a through opening 395 of a stiffener 39 and laterally surrounded by terminals 38 in the stiffener 39. The encapsulated device 20 is fabricated by removing the sacrificial carrier 10 of FIG. 58. After removal of the sacrificial carrier 10, a second semiconductor chip 36 is electrically coupled to the first routing circuitry 21 by first bumps 41, followed by electrically coupling the heat spreader 31 of FIG. 67 to the first routing circuitry 21 by second bumps 43 and third bumps 45.

Figure 73:
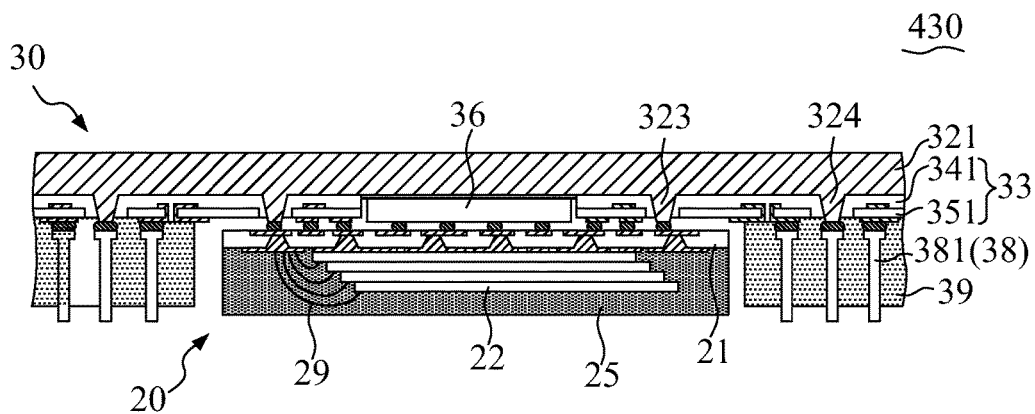
FIG. 73 is a cross-sectional view of yet another aspect of the semiconductor assembly in accordance with the fourth embodiment of the present invention.

FIG. 73 is a cross-sectional view of yet another aspect of the semiconductor assembly according to the fourth embodiment of the present invention. The semiconductor assembly 430 has wires 29 for electrical connection between the first routing circuitry 21 and the first semiconductor chips 22. The semiconductor assembly 430 is similar to that illustrated in FIG. 72, except that the first semiconductor chips 22 are electrically coupled to the first routing circuitry 21 by wire bonding.

Embodiment 5

FIGS. 74-77 are schematic views showing a method of making a semiconductor assembly with an external routing circuitry on a stiffener in accordance with the fifth embodiment of the present invention.

For purposes of brevity, any description in Embodiments above is incorporated herein insofar as the same is applicable, and the same description need not be repeated.

Figure 74:
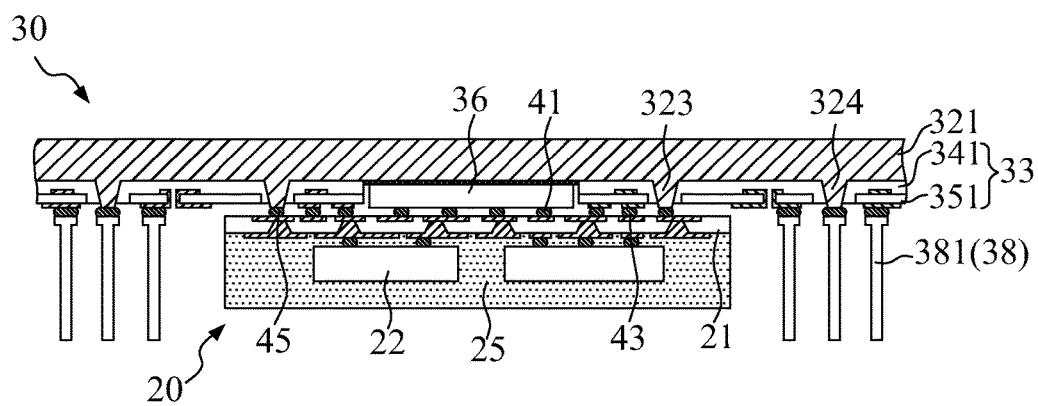
FIG. 74 is a cross-sectional view of the structure with a thermally enhanced device electrically coupled to an encapsulated device in accordance with the fifth embodiment of the present invention.

FIG. 74 is a cross-sectional view of the structure with a thermally enhanced device 30 stacked on and electrically coupled to an encapsulated device 20. In this illustration, the encapsulated device 20 includes a first routing circuitry 21, first semiconductor chips 22 and an encapsulant 25, whereas the thermally enhanced device 30 includes a shielding lid 321, an array of posts 323, 324, a second routing circuitry 33, a second semiconductor chip 36 and an array of terminals 38. The encapsulated device 20 is fabricated by removing the sacrificial carrier 10 of FIG. 58. After removal of the sacrificial carrier 10, a second semiconductor chip 36 is electrically coupled to the first routing circuitry 21 by first bumps 41, followed by electrically coupling the heat spreader 31 of FIG. 66 to the first routing circuitry 21 by second bumps 43 and third bumps 45.

Figure 75:
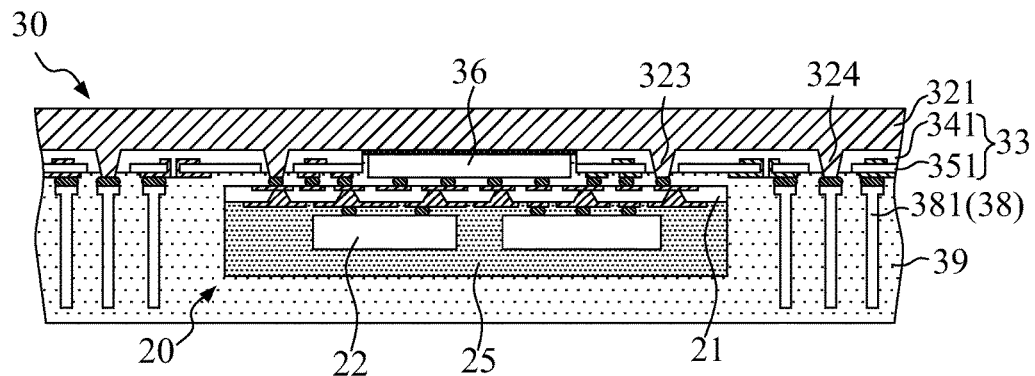
FIG. 75 is a cross-sectional view of the structure of FIG. 74 further provided with a stiffener in accordance with the fifth embodiment of the present invention.

FIG. 75 is a cross-sectional view of the structure with a stiffener 39 on the encapsulated device 20 and the thermally enhanced device 30. The stiffener 39 covers the encapsulated device 20, the second routing circuitry 33 and the terminals 38 from below, and surrounds and conformally coats and covers sidewalls of the encapsulated device 20 and the terminals 38.

Figure 76:
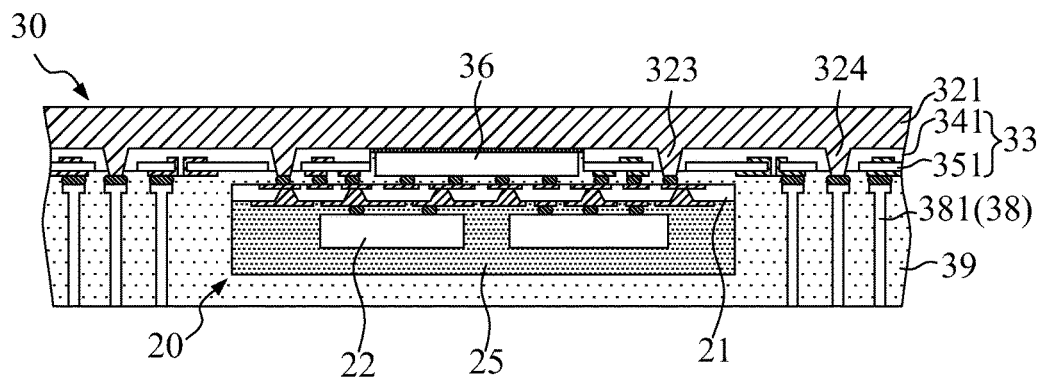
FIG. 76 is a cross-sectional view of the structure of FIG. 75 after removal of a bottom portion of the stiffener in accordance with the fifth embodiment of the present invention.

FIG. 76 is a cross-sectional view of the structure with the terminals 38 exposed from below by removing a lower portion of the stiffener 39. In this illustration, the terminals 38 have an exposed surface substantially coplanar with the exterior surface of the stiffener 39.

Figure 77:
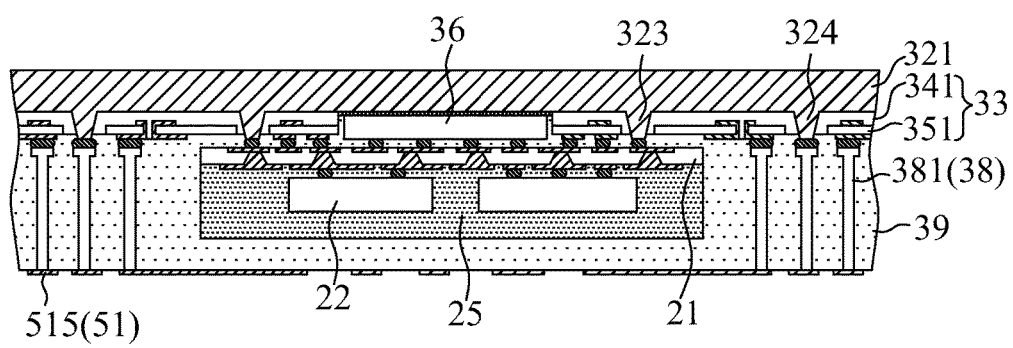
FIG. 77 is a cross-sectional view of the structure of FIG. 76 further provided with exterior conductive traces to finish the fabrication of a semiconductor assembly in accordance with the fifth embodiment of the present invention.

FIG. 77 is a cross-sectional view of the structure provided with exterior conductive traces 515 on the stiffener 39. The exterior conductive traces 515 laterally extend on the exterior surface of the stiffener 39 and contact the terminals 38. At this stage, the formation of an external routing circuitry 51 on the exterior surface of the stiffener 39 is accomplished.

Accordingly, as shown in FIG. 77, a semiconductor assembly 510 is accomplished and includes a first routing circuitry 21, first semiconductor chips 22, an encapsulant 25, a shielding lid 321, an array of posts 323, 324, a second routing circuitry 33, a second semiconductor chip 36, an array of terminals 38, a stiffener 39 and an external routing circuitry 51.

The first routing circuitry 21 and the second routing circuitry 33 provide staged fan-out routings for the first semiconductor chip 22 and the second semiconductor chip 36. The terminals 38 sealed in the stiffener 39 provide electrical connection between the external routing circuitry 51 and the second routing circuitry 33 and between the external routing circuitry 51 and the posts 324. The shielding lid 321 provides thermal dissipation for the second semiconductor chip 36, and also offers effective EMI shielding for the second semiconductor chip 36 by the posts 323, 324 respectively in electrical connection with the first routing circuitry 21 and the terminals 38 for ground connection.

The semiconductor assemblies described above are merely exemplary. Numerous other embodiments are contemplated. In addition, the embodiments described above can be mixed-and-matched with one another and with other embodiments depending on design and reliability considerations. The encapsulated device can include multiple first semiconductor chips and be electrically coupled to multiple second semiconductor chips, and the second semiconductor chip can share or not share the cavity of the heat spreader with other second semiconductor chips. For instance, a cavity can accommodate a single second semiconductor chip, and the heat spreader can include multiple cavities arranged in an array for multiple second semiconductor chips. Alternatively, numerous second semiconductor chips can be positioned within a single cavity of the heat spreader. Additionally, an encapsulated device can share or not share the heat spreader with other encapsulated devices. For instance, a single encapsulated device can be connected to the heat spreader. Alternatively, numerous encapsulated devices may be connected to the heat spreader. For instance, four encapsulated devices in a 2×2 array can be connected to the heat spreader and the second routing circuitry of the heat spreader can include additional conductive traces to receive and route additional encapsulated devices.

As illustrated in the aforementioned embodiments, a distinctive semiconductor assembly is configured and includes an encapsulated device and a thermally enhanced device in a face-to-face stacking configuration. The encapsulated device includes a first semiconductor chip, a first routing circuitry and an encapsulant, and the thermally enhanced device includes a second semiconductor chip and a heat spreader. The first semiconductor chip is sealed in the encapsulant, whereas the second semiconductor chip is placed within a cavity of the heat spreader and not sealed by an encapsulant. In the semiconductor assembly, an array of terminals for external connection may be provided in the encapsulant of the encapsulated device, or provided on a second routing circuitry of the heat spreader to surround the encapsulated device. Optionally, a resin may be further provided to fill in a space between the first routing circuitry and the second semiconductor chip and between the first routing circuitry and the second routing circuitry and fill up a gap located in the cavity of the heat spreader between the second semiconductor chip and the sidewalls of the cavity.

For the convenience of below description, the direction in which the first surface of the encapsulant faces is defined as the first direction, and the direction in which the second surface of the encapsulant faces is defined as the second direction.

The first and second semiconductor chips can be packaged or unpackaged chips. For instance, the first and second semiconductor chips can be bare chips, or wafer level packaged dies, etc. Alternatively, the first and second semiconductor chips can be stacked-die chips. In a preferred embodiment, an encapsulated device having the first semiconductor chip electrically coupled to the first routing circuitry is prepared by the steps of: electrically coupling the first semiconductor chip to the first routing circuitry detachably adhered over a sacrificial carrier; providing the encapsulant and optionally the terminals over the first routing circuitry; and removing the sacrificial carrier from the first routing circuitry. The first semiconductor chip can be electrically coupled to the first routing circuitry by a well-known flip chip bonding process with its active surface facing in the first routing circuitry using bumps without metallized vias in contact with the first semiconductor chip, or by wire bonding process with its active surface facing away the first routing circuitry. Likewise, after removal of the sacrificial carrier, the second semiconductor chip can be electrically coupled to the first routing circuitry by a well-known flip chip bonding process with its active surface facing in the first routing circuitry using bumps without metallized vias in contact with the second semiconductor chip. In the aspect of the first semiconductor chip being flip-chip mounted on the first routing circuitry, a heat spreader may be optionally attached to an inactive surface of the first semiconductor chip before or after the step of providing the encapsulant. As a result, the heat generated by the first semiconductor chip can be conducted away through the heat spreader. Additionally, the encapsulated device may be fabricated by another process that includes steps of: attaching the first semiconductor chip to a heat spreader typically by a thermally conductive adhesive; providing the encapsulant over the heat spreader; and forming the first routing circuitry over an active surface of the first semiconductor chip and the encapsulant, with the first semiconductor chip being electrically coupled to the first routing circuitry. In this process, the first routing circuitry can be electrically coupled to the first semiconductor chip by direct build-up process. Further, an alignment guide may be provided to ensure the placement accuracy of the first semiconductor chip on the heat spreader. Specifically, the alignment guide projects from a surface of the heat spreader, and the first semiconductor chip is attached to the heat spreader with the alignment guide laterally aligned with the peripheral edges of the first semiconductor chip. As the alignment guide extending beyond the inactive surface of the first semiconductor chip in the first direction and in close proximity to the peripheral edges of the first semiconductor chip, any undesirable movement of the first semiconductor chip can be avoided. As a result, a higher manufacturing yield for the first routing circuitry interconnected to the first semiconductor chip can be ensured.

The alignment guide can have various patterns against undesirable movement of the first semiconductor chip. For instance, the alignment guide can include a continuous or discontinuous strip or an array of posts. Alternatively, the alignment guide may laterally extend to the peripheral edges of the heat spreader and have inner peripheral edges that conform to the peripheral edges of the first semiconductor chip. Specifically, the alignment guide can be laterally aligned with four lateral surfaces of the first semiconductor chip to define an area with the same or similar topography as the first semiconductor chip and prevent the lateral displacement of the first semiconductor chip. For instance, the alignment guide can be aligned along and conform to four sides, two diagonal corners or four corners of the first semiconductor chip so as to confine the dislocation of the first semiconductor chip laterally. Besides, the alignment guide around the inactive surface of the first semiconductor chip preferably has a height in a range of 5-200 microns.

The first routing circuitry can be a buildup circuitry without a core layer. Preferably, the first routing circuitry is a multi-layered buildup circuitry and can include at least one dielectric layer and conductive traces that fill up via openings in the dielectric layer and extend laterally on the dielectric layer. The dielectric layer and the conductive traces are serially formed in an alternate fashion and can be in repetition when needed. The first routing circuitry has one side facing in the first direction and provided with first and second contact pads respectively for second semiconductor chip connection and second routing circuitry connection, and the other side facing in the second direction and provided with electrical contacts for first semiconductor chip connection. The first contact pads have pad size and pitch that match I/O pads of the second semiconductor chip, and can be electrically coupled to the second semiconductor chip by first bumps. The second contact pads have pad size and pad pitch that are larger than those of the first contact pads and I/O pads of the first and second semiconductor chips and match the second routing circuitry, and can be interconnected to second routing circuitry by second bumps. As a result, the first routing circuitry can provide primary fan-out routing/interconnection and the shortest interconnection distance between the first and second semiconductor chips.

The heat spreader includes a shielding lid, posts and a second routing circuitry. Preferably, the shielding lid and the posts are integrated as one piece and made of a thermally and electrically conductive material. As a result, the shielding lid can provide thermal dissipation for the second semiconductor chip attached thereto using a thermally conductive contact element, such as solder or organic resin having blended metal particles. The second routing circuitry laterally surrounds the second semiconductor chip and the posts of the heat spreader, and may be a multi-layered routing circuitry that includes at least one insulating layer and conductive traces. The insulating layer and the conductive traces are serially formed in an alternate fashion and can be in repetition when needed. In a preferred embodiment, the second routing circuitry includes a binding film and a routing substrate. The routing substrate preferably include an insulating layer, conductive traces on both opposite sides of the insulating layer, and metallized holes extending through the insulating layer to provide electrical connections between the conductive traces. By the binding film, the routing substrate can be bonded to the shielding lid and the posts of the heat spreader. More specifically, the posts of the heat spreader are disposed within apertures of the routing substrate, and the binding film between the shielding lid and the routing substrate is forced into and fills up gaps in the apertures between the posts and the routing substrate. As a result, the binding film can provide robust mechanical bonds between the shielding lid and the routing substrate and between the posts and the routing substrate. Optionally, the second routing circuitry may further include at least one buildup insulating layer and additional conductive traces that fill up via openings in the buildup insulating layer and extend laterally on the buildup insulating layer. For ground connection, the second routing circuitry may be further electrically coupled to the shielding lid and the posts through metallized vias in contact with the posts. For instance, the second routing circuitry may include metallized vias in the buildup insulating layer that are formed in contact with the posts of the heat spreader. As an alternative, the posts may extend through the second routing circuitry and are aligned with the first routing circuitry, and an array of third bumps may be provided in contact with the posts and the first routing circuitry so as to provide electrical and thermal connection between the shielding lid and the encapsulated device. Accordingly, the shielding lid and the posts can be electrically coupled to the first routing circuitry.

For next-level connection, an array of terminals may be provided in the encapsulant of the encapsulated device, or be disposed beyond and surround peripheral edges of the encapsulated device. The terminals can include metal pillars, solder balls, conductive vias, metal pins or a combination thereof, and provide electrical contacts for next-level connection. In the aspect of no terminals being provided in the encapsulated device, the second routing circuitry includes at least one conductive trace that laterally extends beyond the peripheral edges of the first routing circuitry to provide electrical contacts for external connection. More specifically, the second routing circuitry may include first and second terminal pads respectively for first routing circuitry connection and external connection from the second direction. Preferably, the first terminal pads have pad size and pad pitch that are larger than I/O pads of the first and second semiconductor chips and match second contact pads of the first routing circuitry, whereas the second terminal pads have pad size and pad pitch that are larger than those of the first terminal pads and match next-level connection. Accordingly, in the aspect of the second routing circuitry laterally extending beyond the encapsulated device, the heat spreader may further include an array of terminals that are electrically coupled to the second routing circuitry and surround the encapsulated device. For ground connection, some of the terminals preferably are further electrically coupled to the shielding lid by the second routing circuitry in electrical connection with the posts, or by an array of fourth bumps disposed on additional posts projecting from the surface of the shielding lid and aligned with the area beyond the peripheral edges of the encapsulated device. Additionally, the heat spreader may further include a stiffener that covers sidewalls of the terminals. The stiffener typically is a resin molded stiffener and may have a through opening to accommodate the encapsulated device. As an alternative, the stiffener may be provided to encapsulate the terminals and the encapsulated device after electrically coupling the heat spreader to the encapsulated device. In a preferred embodiment, the stiffener laterally extends to the peripheral edges of the heat spreader. As for the alternative aspect of the terminals being provided in the encapsulated device, the terminals can be formed to be electrically connected to the first routing circuitry before or after provision of the encapsulant. In a preferred embodiment, the terminals are located at the peripheral area of the first routing circuitry and extend from the first routing circuitry towards the second surface of the encapsulant in the second direction. As a result, the terminals can have a first end in contact with the first routing circuitry and an opposite second end adjacent to the second surface of the encapsulant.

Optionally, an external routing circuitry may be further formed over the second surface of the encapsulant in the aspect of the terminals being provided in the encapsulated device, or be formed over an exterior surface of the stiffener in the alternative aspect of the terminals being provided beyond the encapsulated device. The external routing circuitry may be a buildup circuitry and is electrically coupled to the terminals. More specifically, the encapsulated device can further include conductive traces that contact and are electrically connected to the terminals in the encapsulant and laterally extend over the second surface of the encapsulant; alternatively, the semiconductor assembly may further include conductive traces that contact and are electrically connected to the terminals in the stiffener and laterally extend over the exterior surface of the stiffener. Further, the external routing circuitry may be a multi-layer routing circuitry that include one or more dielectric layers, via openings in the dielectric layer, and additional conductive traces if needed for further signal routing. The outmost conductive traces of the external routing circuitry can accommodate conductive joints, such as solder balls, for electrical communication and mechanical attachment with for the next level assembly or another electronic device.

The term "cover" refers to incomplete or complete coverage in a vertical and/or lateral direction. For instance, in the cavity-up position, the shielding lid of the heat spreader covers the second semiconductor chip in the downward direction regardless of whether another element such as the thermally conductive contact element is between the second semiconductor chip and the shielding lid.

The phrases "attached on" and "mounted on" includes contact and non-contact with a single or multiple element(s). For instance, the shielding lid of the heat spreader is attached to the inactive surface of the second semiconductor chip regardless of whether it is separated from the second semiconductor chip by a thermally conductive contact element.

The phrase "aligned with" refers to relative position between elements regardless of whether elements are spaced from or adjacent to one another or one element is inserted into and extends into the other element. For instance, the alignment guide is laterally aligned with the first semiconductor chip since an imaginary horizontal line intersects the alignment guide and the first semiconductor chip, regardless of whether another element is between the alignment guide and the first semiconductor chip and is intersected by the line, and regardless of whether another imaginary horizontal line intersects the first semiconductor chip but not the alignment guide or intersects the alignment guide but not the first semiconductor chip. Likewise, the second semiconductor chip is aligned with the cavity of the heat spreader.

The phrase "in close proximity to" refers to a gap between elements not being wider than the maximum acceptable limit. As known in the art, when the gap between the first semiconductor chip and the alignment guide is not narrow enough, the location error of the first semiconductor chip due to the lateral displacement of the first semiconductor chip within the gap may exceed the maximum acceptable error limit. In some cases, once the location error of the first semiconductor chip goes beyond the maximum limit, it is impossible to align the predetermined portion of the first semiconductor chip with a laser beam, resulting in the electrical connection failure between the first semiconductor chip and the first routing circuitry. According to the pad size of the first semiconductor chip, those skilled in the art can ascertain the maximum acceptable limit for a gap between the first semiconductor chip and the alignment guide through trial and error to ensure the metallized vias of the routing circuitry being aligned with the I/O pads of the first semiconductor chip. Thereby, the description "the alignment guide is in close proximity to the peripheral edges of the first semiconductor chip" means that the gap between the peripheral edges of the first semiconductor chip and the alignment guide is narrow enough to prevent the location error of the first semiconductor chip from exceeding the maximum acceptable error limit. For instance, the gaps in between the first semiconductor chip and the alignment guide may be in a range of about 5 to 50 microns.

The phrases "electrical connection", "electrically connected" and "electrically coupled" refer to direct and indirect electrical connection. For instance, in the aspect of the terminals being provided in the encapsulant, the terminals directly contact and are electrically connected to the first routing circuitry, and the second semiconductor chip is spaced from and electrically connected to the first routing circuitry by the first bumps.

The "first direction" and "second direction" do not depend on the orientation of the semiconductor assembly, as will be readily apparent to those skilled in the art. For instance, the first surface of the encapsulant faces the first direction and the second surface of the encapsulant faces the second direction regardless of whether the semiconductor assembly is inverted. Thus, the first and second directions are opposite one another and orthogonal to the lateral directions. Furthermore, the first direction is the upward direction and the second direction is the downward direction in the cavity-down position, and the first direction is the downward direction and the second direction is the upward direction in the cavity-up position.

The semiconductor assembly according to the present invention has numerous advantages. For instance, the first and second semiconductor chips are mounted on opposite sides of the first routing circuitry, which can offer the shortest interconnect distance between the first and second semiconductor chips. The first routing circuitry provides primary fan-out routing/interconnection for the first and second semiconductor chips whereas the terminals offer electrical contacts for external connection or next-level routing circuitry connection. As the second semiconductor chip and the heat spreader are electrically coupled to the first routing circuitry by bumps, not by direct build-up process, the simplified process steps result in lower manufacturing cost. The external routing circuitry can provide external pads populated all over the area to increase external electrical contacts for next-level assembly. The heat spreader can provide thermal dissipation, electromagnetic shielding and moisture barrier for the second semiconductor chip, and also provides mechanical support for the assembly. The semiconductor assembly made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A semiconductor assembly with electromagnetic shielding and thermally enhanced characteristics, comprising:
    an encapsulated device that includes a first semiconductor chip, an encapsulant, and a first routing circuitry disposed on a first surface of the encapsulant, wherein the first semiconductor chip is embedded in the encapsulant and electrically coupled to the first routing circuitry;
    a thermally enhanced device that includes a heat spreader and a second semiconductor chip, wherein the heat spreader has a shielding lid, posts and a second routing circuitry disposed over a surface of the shielding lid, wherein (i) the second routing circuitry includes an insulating layer and conductive traces laterally extending on two opposite sides of the insulating layer, (ii) the second semiconductor chip is disposed in a through opening of the second routing circuitry laterally surrounded by the conductive traces and is attached to the shielding lid by a thermally conductive contact element in direct contact with the second semiconductor chip and the shielding lid, (iii) the posts project from the surface of the shielding lid and are laterally surrounded by the conductive traces of the second routing circuitry, and (iv) the shielding lid and the posts altogether are formed as an integrated piece of metal or alloy; and
    the thermally enhanced device is stacked over the encapsulated device with the second semiconductor chip electrically coupled to the first routing circuitry by an array of first bumps and the first routing circuitry electrically coupled to the second routing circuitry by an array of second bumps, wherein the array of first bumps are in direct contact with the first routing circuitry and the second semiconductor chip, and the array of second bumps are in direct contact with the first routing circuitry and the second routing circuitry.

2. The semiconductor assembly of claim 1, wherein the posts of the heat spreader are electrically connected to the second routing circuitry.

3. The semiconductor assembly of claim 1, further comprising an array of third bumps disposed over the posts so as to provide electrical and thermal connection between the shielding lid and the encapsulated device.

4. The semiconductor assembly of claim 1, wherein the second routing circuitry includes at least one conductive trace laterally extending beyond peripheral edges of the encapsulated device.

5. The semiconductor assembly of claim 4, further comprising an array of terminals that are electrically coupled to the second routing circuitry and the shielding lid and surround the encapsulated device.

6. The semiconductor assembly of claim 5, further comprising a stiffener that covers sidewalls of the terminals.

7. The semiconductor assembly of claim 5, further comprising an array of fourth bumps disposed on the posts so as to provide electrical connection between the shielding lid and the terminals.

8. The semiconductor assembly of claim 6, further comprising an external routing circuitry disposed over an exterior surface of the stiffener, wherein the external routing circuitry is electrically coupled to the terminals.

9. The semiconductor assembly of claim 1, wherein the encapsulated device further includes an array of terminals in the encapsulant that surround the first semiconductor chip and are electrically coupled to the first routing circuitry and the shielding lid and extend towards a second surface of the encapsulant opposite to the first surface.

10. The semiconductor assembly of claim 9, wherein the array of terminals in the encapsulant are electrically connected to the posts and the shielding lid through the first routing circuitry of the encapsulated device.

11. The semiconductor assembly of claim 9, wherein the encapsulated device further includes an external routing circuitry disposed on the second surface of the encapsulant and electrically coupled to the array of terminals in the encapsulant.

\* \* \* \* \*